US012677450B2

(12) United States Patent
Hsieh et al.

(10) Patent No.: US 12,677,450 B2
(45) Date of Patent: Jul. 7, 2026

(54) SiC MOSFETS WITH SATURATION CURRENT PINCHING STRUCTURES

(71) Applicant: Nami MOS CO., LTD., New Taipei City (TW)

(72) Inventors: Fu-Yuan Hsieh, New Taipei City (TW); Lin Xu, Shanghai (CN)

(73) Assignee: NAMI MOS CO., LTD., New Taipei City (TW)

( * ) Notice: Subject to any disclaimer, the term of this patent is extended or adjusted under 35 U.S.C. 154(b) by 408 days.

(21) Appl. No.: 18/414,819

(22) Filed: Jan. 17, 2024

(65) Prior Publication Data

US 2025/0234601 A1    Jul. 17, 2025

(51) Int. Cl.
| | |
|---|---|
| *H10D 62/10* | (2025.01) |
| *H10D 62/17* | (2025.01) |
| *H10D 62/832* | (2025.01) |
| *H10D 84/00* | (2025.01) |

(52) U.S. Cl.
CPC ......... *H10D 62/111* (2025.01); *H10D 62/127* (2025.01); *H10D 62/393* (2025.01); *H10D 62/8325* (2025.01); *H10D 84/146* (2025.01)

(58) Field of Classification Search
None
See application file for complete search history.

(56) References Cited

U.S. PATENT DOCUMENTS

| | | | | |
|---|---|---|---|---|
| 2024/0213311 A1* | 6/2024 | Narita | ................ | H10D 62/127 |
| 2025/0133796 A1* | 4/2025 | Hsieh | ................ | H10D 62/393 |

OTHER PUBLICATIONS

Silicon Carbide Power Devices, B jayant Baliga, Published by World Scientific Publishing Co. Pte. Ltd. 2005, Singapore 596224, Fig. 10.1 Shielded Planar MOSFET Structures, p. 260.
Silicon Carbide Power Devices, B jayant Baliga, Published by World Scientific Publishing Co. Pte. Ltd. 2005 5 Toh Tuck Link, Singapore 596224 Fig. 10.1 Shielded Planar MOSFET Structures p. 260.

* cited by examiner

*Primary Examiner* — Bradley Smith
(74) *Attorney, Agent, or Firm* — BACON & THOMAS, PLLC

(57) ABSTRACT

An improved silicon carbide (SiC) super junction (SJ) MOSFET having at least two buried P-shield (BPS) regions facing each other for gate oxide electric-field and saturation current reductions is disclosed. The two BPS regions are spaced apart from a body region and formed either adjoining sidewalls or below a bottom of a P column region. Moreover, a saturation current pitching (SCP) structure formed in a Junction Field Effect Transistor (JFET) region sandwiched between the two BPS regions limits saturation current of the device in a forward conduction stage for the short-circuit capability improvement.

20 Claims, 20 Drawing Sheets

SiC MOSFETS WITH SATURATION CURRENT PINCHING STRUCTURES

FIELD OF THE INVENTION

This invention relates generally to semiconductor devices, and more particularly, to a silicon carbide (SiC) super junction (SJ) Metal Oxide Semiconductor Field Effect Transistor (MOSFET) having at least two buried P-shield (BPS) regions facing each other in each unit cell, spaced apart from body regions and adjoining a P column (PC) region of a SJ structure for gate oxide electric field and specific on-resistance reductions. At least one saturation current pinching (SCP) structure formed in a vertical Junction Field Effect Transistor (JFET) region sandwiched between the two BPS regions limits saturation current of the device in a forward conduction stage for the short-circuit capability improvement.

BACKGROUND OF THE INVENTION

Because of the physical properties of SiC, SiC-MOSFETs can achieve a higher breakdown voltage, a lower on-resistance and a higher switching speed than Si-MOSFETs. However, SiC-MOSFETs have a much higher electric-field strength at the gate oxide than Si-MOSFETs because the breakdown electric field strength of SiC is 10 times higher than that of Si. To resolve this problem, a P+ shielding region is disposed under an N+ source region as well as a P-base region as shown in FIG. 1 (FIG. 10.1 of Silicon Carbide Power Devices, B Jayant Baliga's book, page 260) as a field relaxing layer near the gate oxide. Unfortunately, a short-circuit (SC) failure is still the most serious reliable issue for the shielded SiC-MOSFETs device due to the much smaller device area comparing with Si-MOSFETs resulting in a higher junction temperature before the failure. During the SC transient process, the high direct current (DC) voltage and the large saturation current would be applied to the device, resulting in the device's performance degradation or even severe burnout failure if the devices do not have a sufficient SC withstand capability.

Therefore, there is still a need in the art of the SiC-MOSFETs design and fabrication to provide a novel cell structure, device configuration and manufacturing process that would make the SiC-MOSFETs have a lower electric-field strength at the gate oxide, achieve a lower specific on-resistance and have a lower saturation current for the short circuit capability improvement.

SUMMARY OF THE INVENTION

The present invention discloses a SiC SJ MOSFET having two BPS regions facing each other disposed in a drift region adjoining a PC region of a SJ structure, and spaced apart from a body (or base) region for the gate oxide electric-field reduction. A location of the two BPS regions can be optimized to obtain a low specific on-resistance while simultaneously shielding the gate oxide interface from the high electric field in the drift region. The two BPS regions can be disposed on sidewalls or/and a bottom of the PC region. Moreover, a SCP structure formed in a vertical JFET region sandwiched between the two BPS regions clamps the potential, thus limiting the saturation current in a forward conduction stage for the short-circuit capability improvement.

A SiC device comprising a plurality of unit cells with each unit cell in an active area, comprising: an epitaxial layer of the first conductivity type having multiple sub-epitaxial layers grown on a substrate; a source region of a first conductivity type formed at a top portion of the epitaxial layer and encompassed in a body region of a second conductivity type; a SJ structure generated by the epitaxial layer with a PC region of the second conductivity type disposed above the substrate and connecting to the body region; a planar gate electrode made of a doped poly-silicon layer padded by a gate oxide; a first type JFET region of the first conductivity type formed between the two adjacent body regions; at least two BPS regions of the second conductivity type facing each other with a doping concentration higher than a doping concentration of the PC region, adjoining the PC region and spaced apart from the body regions; a second type JFET region of the first conductivity type formed between the two BPS regions; the source and body regions shorted together to a source metal; the PC region has a linear, a square, a hexagonal or an octagonal cell topology; the hexagonal cell topology is disclosed here with detailed description as an example because it has the lowest specific on-resistance; the gate oxide having a thick oxide in a central portion of the gate oxide; the two BPS regions adjoining sidewalls of the PC region, or adjoining a bottom of the PC region with a width wider than a width of the PC region.

According to another aspect, the substrate has the first conductivity type and further comprises a buffer layer of the first conductivity type with a resistivity Rb sandwiched between the substrate and the PC region, wherein the Rb is higher than a resistivity of the epitaxial layer.

According to another aspect, wherein the substrate has the second conductivity type and further comprises a buffer layer of the first conductivity type with a resistivity Rb sandwiched between the substrate and the epitaxial layer, wherein the Rb is less than a resistivity of the epitaxial layer.

According to another aspect, wherein the substrate has the second conductivity type, further comprises: a buffer layer of the first conductivity type formed sandwiched between the substrate and the PC region; a plurality of heavily doped regions of the first conductivity type in the substrate to form a plurality of alternating $P_+$ and $N^+$ regions in the substrate.

According to another aspect, the invention features an integrated circuit comprising a SiC MOSFET and a SiC SBR disposed in one unit cell having an asymmetric planar gate electrode structure comprising: an epitaxial layer of a first conductivity type extending over a substrate of the first conductivity type; an asymmetric planar gate electrode structure has a first gate electrode isolated from the epitaxial layer with a first gate oxide for the SiC MOSFET, and a second gate electrode isolated from the epitaxial layer with a second gate oxide for the SiC SBR, wherein the second gate oxide has a thickness less than a thickness of the first gate oxide; a source region of the first conductivity type encompassed in a first body region of a second conductivity type at one side of a top portion of the epitaxial layer in the SiC MOSFET and encompassed in a second body region of the second conductivity at the other side in the SiC SBR; a first channel region formed between the first body region and the source region; a second channel region formed between the second body region and the source region; wherein the second channel region has a channel length shorter than a channel length of the first channel region; the integrated circuit further comprising: a SJ structure comprising a PC region of the second conductivity type disposed above the substrate and connecting to the body region; at least two BPS regions of the second conductivity type facing each other, adjoining the PC region and spaced apart from the body region; a first type JFET region of the first conductivity type formed between the first and the second body regions; a second type JFET region of the first conductivity type formed between the two BPS regions; and the PC region, the source and body regions shorted together to a source metal; the PC region has a linear, hexagonal or octagonal cell topology; the gate oxide having a thick oxide in its central portion; and the two BPS regions adjoining sidewalls of the PC region, or adjoining a bottom of the PC region with a width wider than a width of the PC region.

According to another aspect, a SiC device comprising a plurality of unit cells with each unit cell in an active area, comprising: an epitaxial layer of the first conductivity type grown on a substrate; a gate trench formed in an epitaxial layer, and surrounded by a source region of the first conductivity type encompassed in a body region of a second conductivity type at a top portion of the epitaxial layer; the gate trench being filled with a gate electrode, and insulated from the epitaxial layer by a first insulating film on a bottom of the gate trench, and being insulated from the epitaxial layer along sidewalls by a gate oxide; the first insulating film is thicker than the gate oxide; a source region of a first conductivity type formed at a top portion of the epitaxial layer and encompassed in a body region of a second conductivity type; a SJ structure comprising a PC region of the first conductivity type disposed above the substrate and connecting to the body region; at least two BPS regions adjoining the PC region and spaced apart from the body region; the source and body regions shorted together to a source metal; and a JFET region of the first conductivity type formed between the two BPS regions.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The accompanying drawings, which are included to provide a further understanding of the invention and are incorporated in and constitute a part of this specification, illustrate exemplary embodiments of the invention and together with the description serve to explain the principles of the invention. In the drawings.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
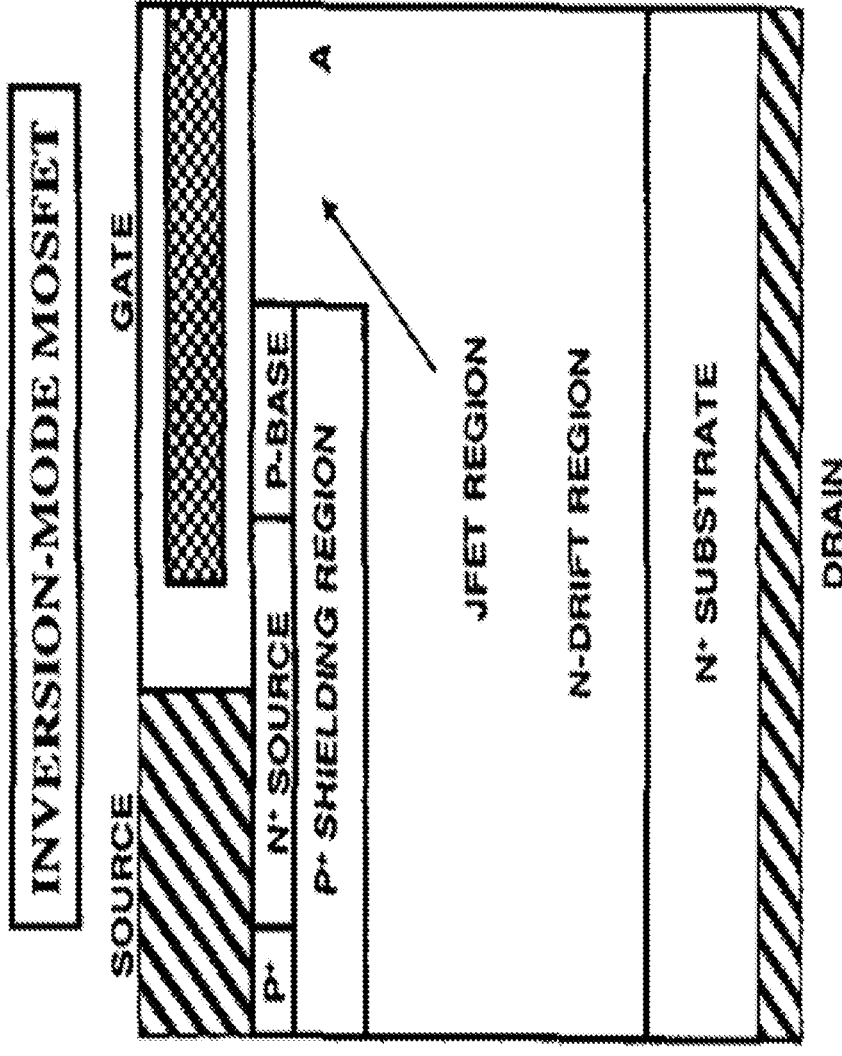
FIG. 1 is a cross-sectional view of a SiC shielded MOSFET device of a prior art.
Figure 2A:
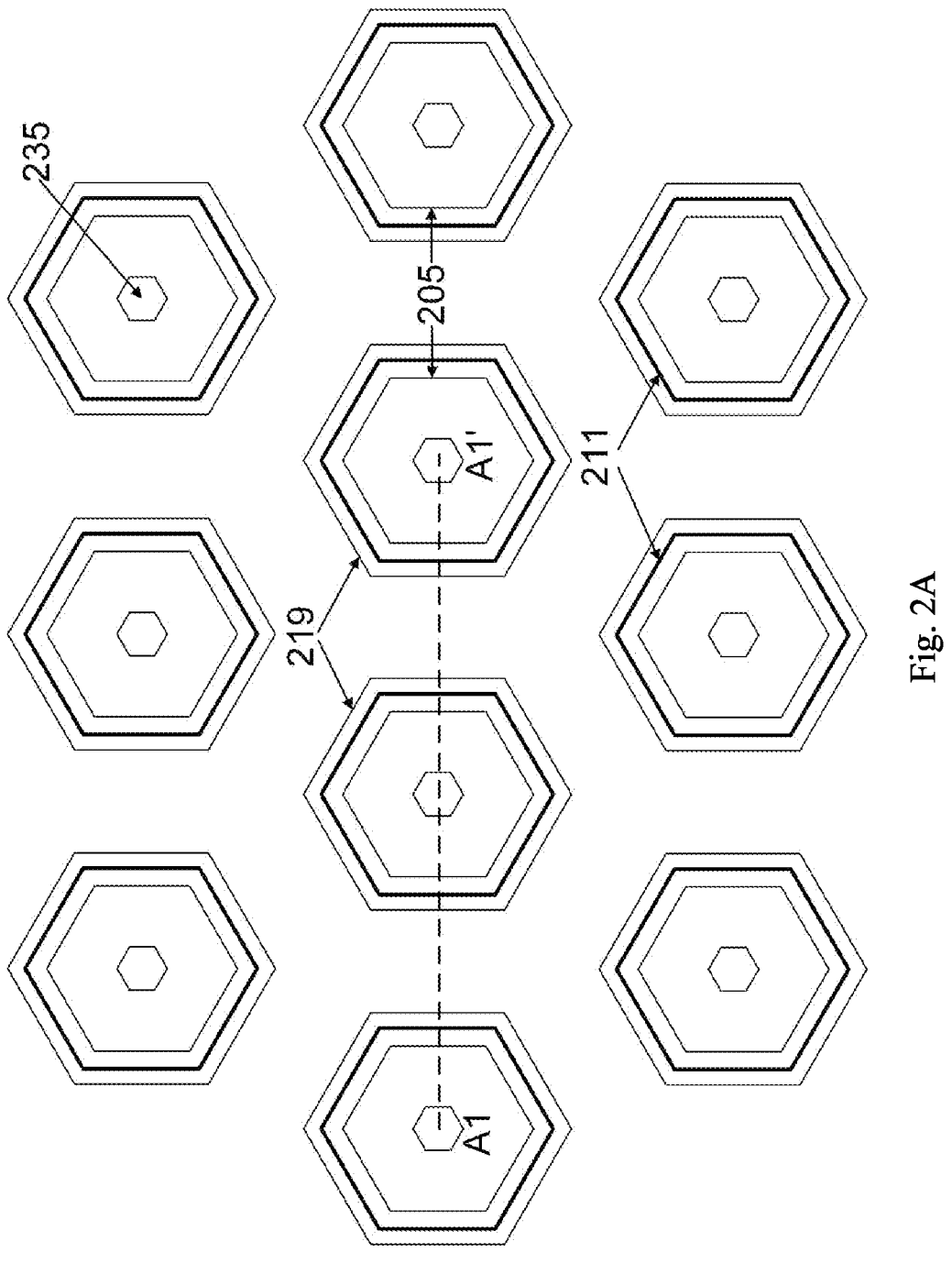
FIG. 2A is a top view of a preferred embodiment with a planar gate electrode according to the present invention.

Please refer to FIG. 2A for a top view of a preferred embodiment for a SiC device comprising a plurality of unit cells with each unit cell in an active area. Each of the unit cells has a P column (PC, as illustrated) region 219 with a hexagonal topology and a source contact 235 surrounded by a gate poly silicon layer 205 as a gate electrode. Moreover, an n+ boundary 211 with a hexagonal shape is formed between the gate poly silicon layer 205 and the PC region 219.

Figure 2B:
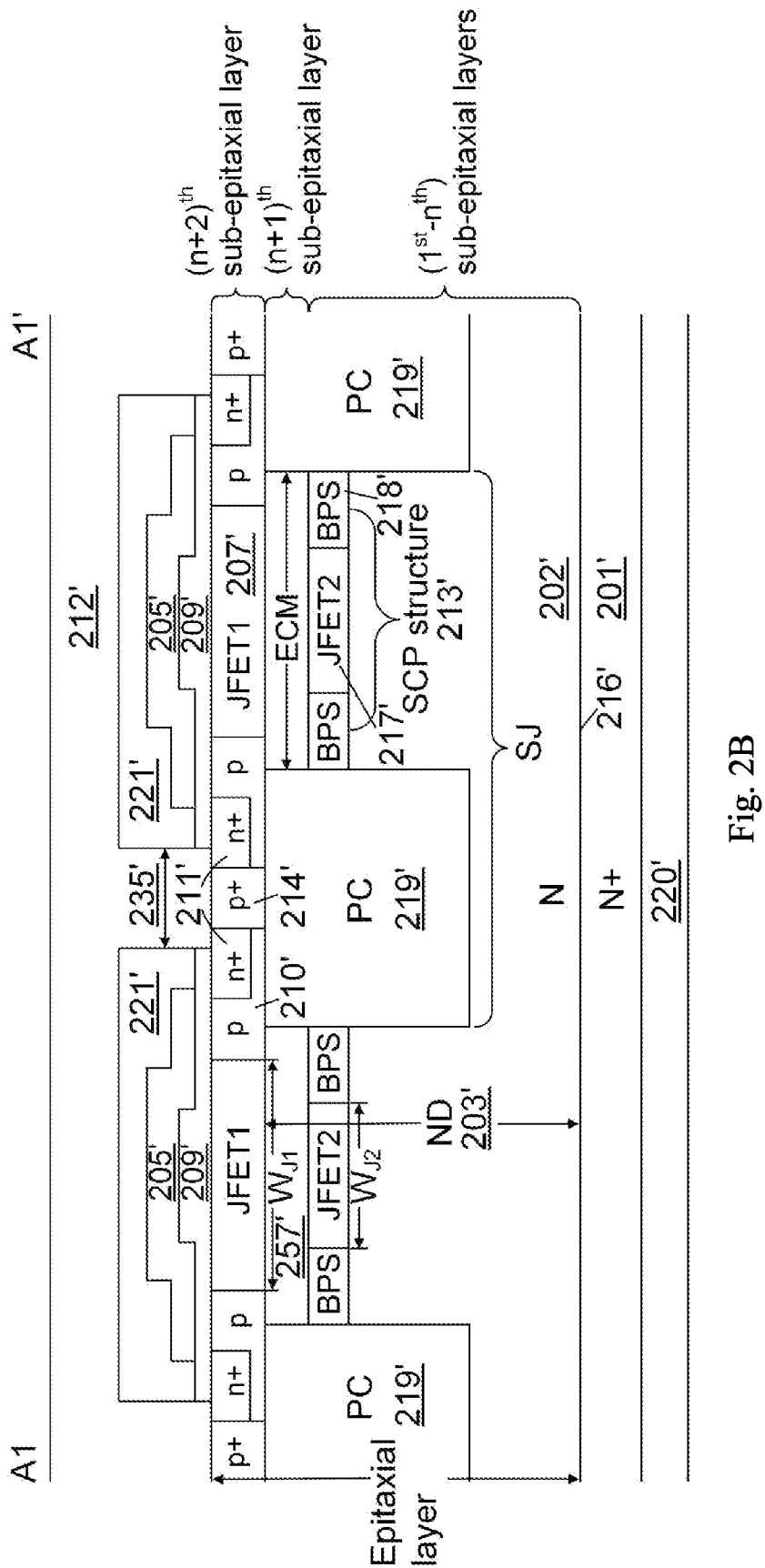
FIG. 2B is a cross-sectional view of a SiC device showing a preferred embodiment along A1-A1' line of FIG. 2A according to the present invention.

Please refer to FIG. 2B for a cross-sectional view showing a preferred A1-A1' cross section of FIG. 2A according to the present invention. The preferred embodiment comprises a SiC device formed on an N+ type SiC substrate 201' with a less doped N type SiC epitaxial layer 202' extending thereon, wherein the N+ substrate 201' is coated with a back metal 220' of Ti/Ni/Ag on the rear side as a drain metal. The p body regions 210' and n+ source regions 211' are formed at a top portion of the N type SiC epitaxial layer 202', wherein the n+ source regions 211' are encompassed in the p body regions 210' and a first type JFET (JFET1, as illustrated) region 207' is formed between the two adjacent p body regions 210'. An N-drift (ND, as illustrated) region 203' of the first conductivity type is formed between the N+ substrate 201' and the JFET1 regions 207'. Inside the N type epitaxial layer 202', a plurality of P column (PC, as illustrated) regions 219' are formed vertically downward from a top surface of the ND region 203' and not reaching the common interface 216' between the N type epitaxial layer 202' and the N+ substrate 201', and thus a p+ heavily doped region 214' is formed between the n+ source regions 211' above the PC columns 219'. A super junction (SJ, as illustrated) structure is generated by the N type epitaxial layer 202' and the PC region 219' disposed above the N+ substrate 201'. Between the two adjacent PC regions 219' in the ND region 203', two buried P-shield (BPS, as illustrated) regions 218' facing each other are formed with a doping concentration higher than that of the PC regions 219' adjoining sidewalls of the PC regions 219' and spaced apart from the p body regions 210'. Moreover, a saturation current pinching (SCP) structure 213' comprising a second type JFET (JFET2, as illustrated) region 217' formed between the two BPS regions 218', wherein the JFET2 region 217' has a width $W_{J2}$ less than a width $W_{J1}$ of the JFET1 region 207', and has a doping concentration higher than a doping concentration of the JFET1 region 207'. A doped poly-silicon layer padded by a gate oxide 209' is formed on the N type epitaxial layer 202' as a planer gate electrode 205' covering the top surfaces of the p body regions 210', the n+ source regions 211' and the JFET1 regions 207', wherein the gate oxide 209' has a thick oxide in its central portion. An interlayer dielectric film 221' is then stacked on the planer gate electrode 205', and a source metal 212' is formed onto the interlayer dielectric film 221', the n+ source regions 211' and the p+ regions 214'. The PC regions 219', the n+ source regions 211' and p body regions 210' are further shorted together to the source metal 212'. The fabrication process of the preferred embodiment is compatible with standard SJ manufacturing process using multiple epitaxial layers growth and multiple ion implantation methods. The SJ structure, the BPS region 218' and the JFET2 region 217' are formed firstly in the 1st to nth (1st-nth) sub-epitaxial layers. An enhanced conductivity modulation (ECM, as illustrated) region 257' of the first conductivity type is then formed in the (n+1)th sub-epitaxial layer with a doping concentration equal to or higher than doping concentrations of the ($1^{st}$-$n^{th}$) sub-epitaxial layers. The source regions 211', the body regions 210', the p+ regions 214' and the JFET1 regions 207' are formed in the (n+2)th sub-epitaxial layer. The ECM region is formed in the ND region 203' between the JFET1 region 207' and JFET region 217'.

Figure 2C:
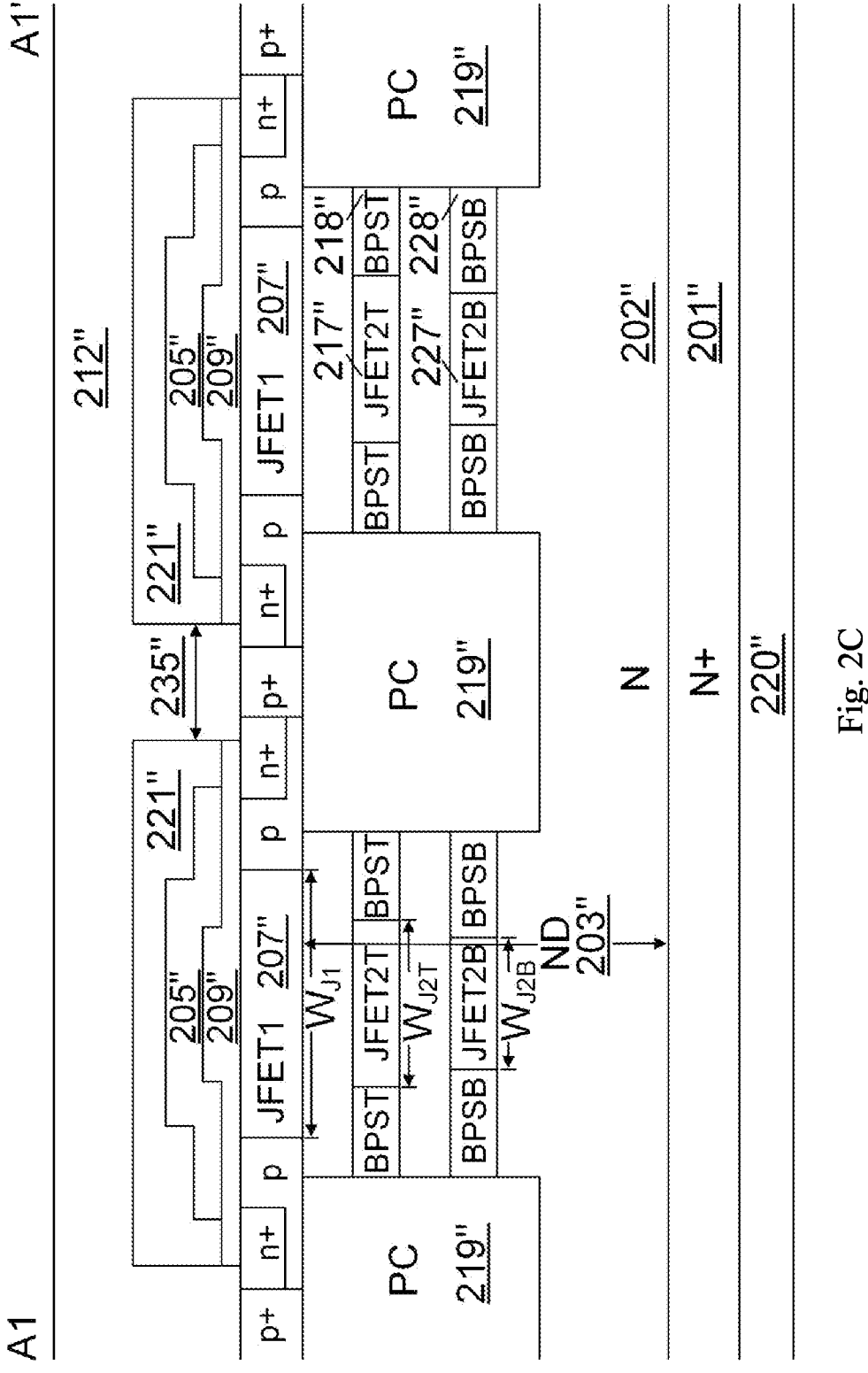
FIG. 2C is a cross-sectional view of a SiC device showing another preferred embodiment along A1-A1' line of FIG. 2A according to the present invention.

Please refer to FIG. 2C for a cross-sectional view showing another preferred A1-A1' cross section of FIG. 2A according to the present invention. The SiC device has a similar structure to FIG. 2B, except that in the present invention, between the two adjacent P column (PC, as illustrated) regions 219" in the N-drift (ND, as illustrated) region 203", two second type JFET regions including a bottom JFET (JFET2B, as illustrated) region 227" with a width $W_{J2B}$ and a top JFET (JFET2T, as illustrated) region 217" above the JFET2B region 227" with a width $W_{J2T}$, and the relationship between $W_{J2B}$ and $W_{J2T}$ is $W_{J2B}<W_{J2T}$, while $W_{J2T}$ is less than a width Wn of the first type JFET (JFET1, as illustrated) region 207", that is $W_{J2B}<W_{J2T}<W_{J1}$. Moreover, the JFET2B regions 227" and JFET2T regions 217" are formed between the two bottom buried P-shield (BPSB, as illustrated) regions 228" and the two top buried P-shield (BPST, as illustrated) regions 218" respectively, and the BPSB regions 228" and BPST regions 218" adjoin sidewalls of the PC regions 219" with doping concentrations higher than a doping concentration of the PC regions 219".

Figure 2D:
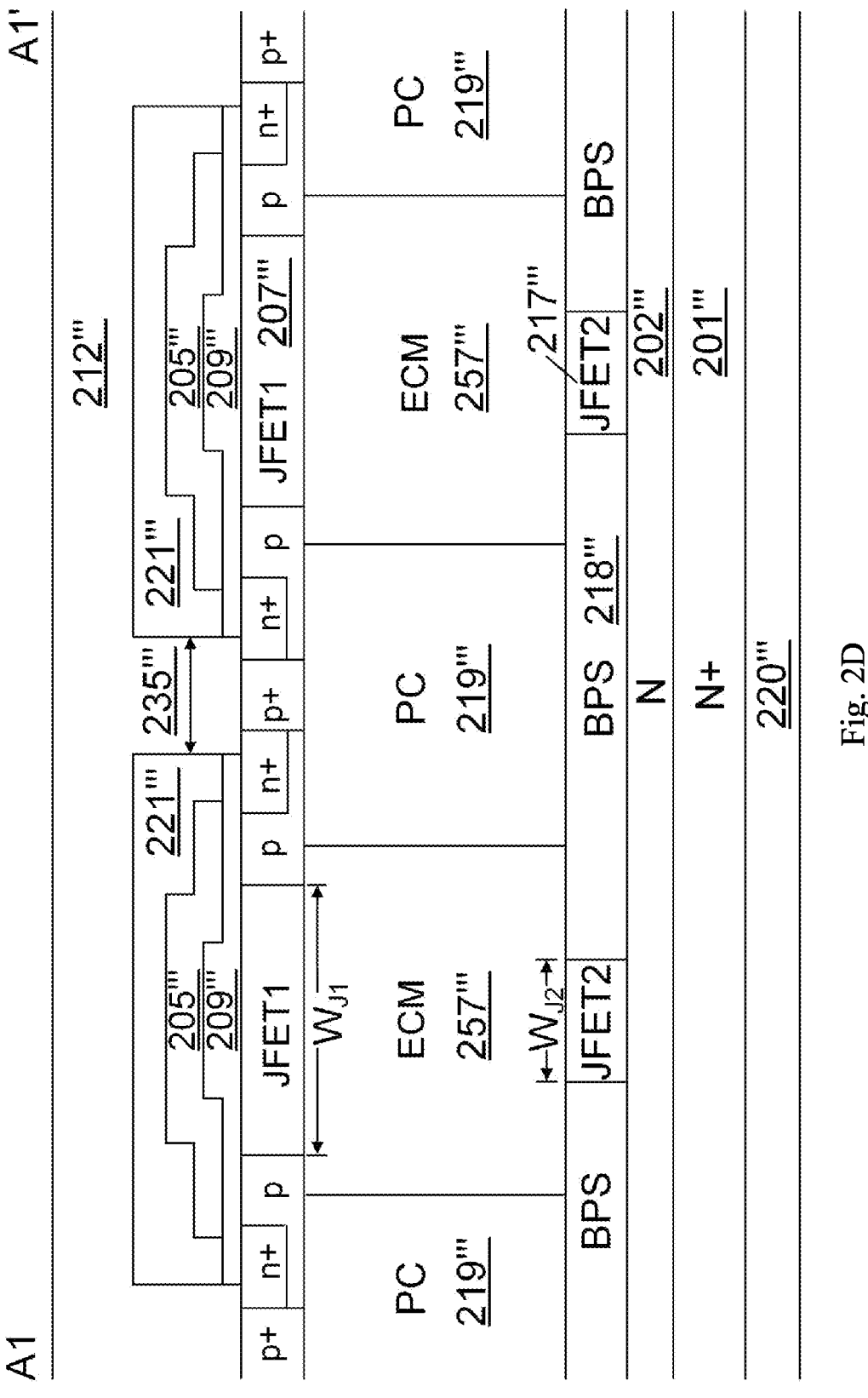
FIG. 2D is a cross-sectional view of a SiC device showing another preferred embodiment along A1-A1' line of FIG. 2A according to the present invention.

Please refer to FIG. 2D for a cross-sectional view showing another preferred A1-A1' cross section of FIG. 2A according to the present invention. The SiC device has a similar structure to FIG. 2B, except that in the present invention, the buried P-shield (BPS, as illustrated) regions 218''' are formed adjoining a bottom surface of the P column (PC, as illustrated) regions 219''' and laterally extending beyond edges of the PC regions 219''' with a width wider than a width of the PC region 219'''. Moreover, a second type JFET (JFET2, as illustrated) region 217''' is formed between the two adjacent BPS regions 218''' with a width $W_{J2}$ less than a width $W_{J1}$ of the first type JFET (JFET1, as illustrated) region 207'''. An enhanced conductivity modulation (ECM, as illustrated) region 257''' of the first conductivity type formed between the JFET1 region 207''' and the JFET2 region 217''' with a doping concentration equal to or higher than a doping concentration of the epitaxial layer 202'''.

Figure 2E:
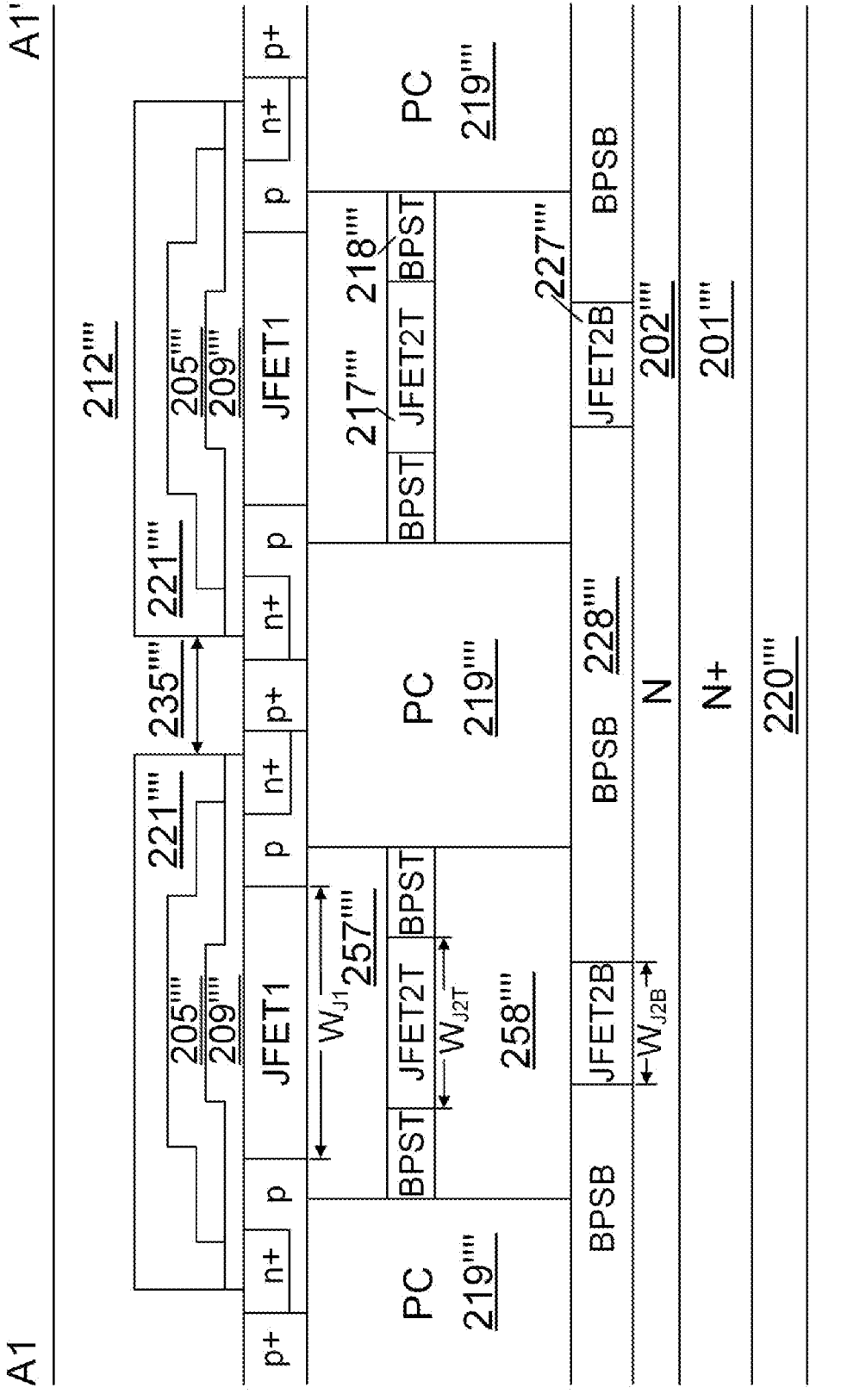
FIG. 2E is a cross-sectional view of a SiC device showing another preferred embodiment along A1-A1' line of FIG. 2A according to the present invention.

Please refer to FIG. 2E for a cross-sectional view showing another preferred A1-A1' cross section of FIG. 2A according to the present invention. The SiC device has a similar structure to FIG. 2C, except that in the present invention, the bottom buried P-shield (BPSB, as illustrated) regions 228"" are formed adjoining a bottom surface of the P column (PC, as illustrated) regions 219"" and laterally extending beyond edges of the PC regions 219"" with a width wider than a width of the PC region 219"". Moreover, a bottom second type JFET (JFET2B, as illustrated) region 227"" is formed between the two adjacent BPSB regions 228"" with a width $W_{J2B}$ less than a width $W_{J2T}$ of the top second type JFET (JFET2T, as illustrated) region 217"".

Figure 3A:
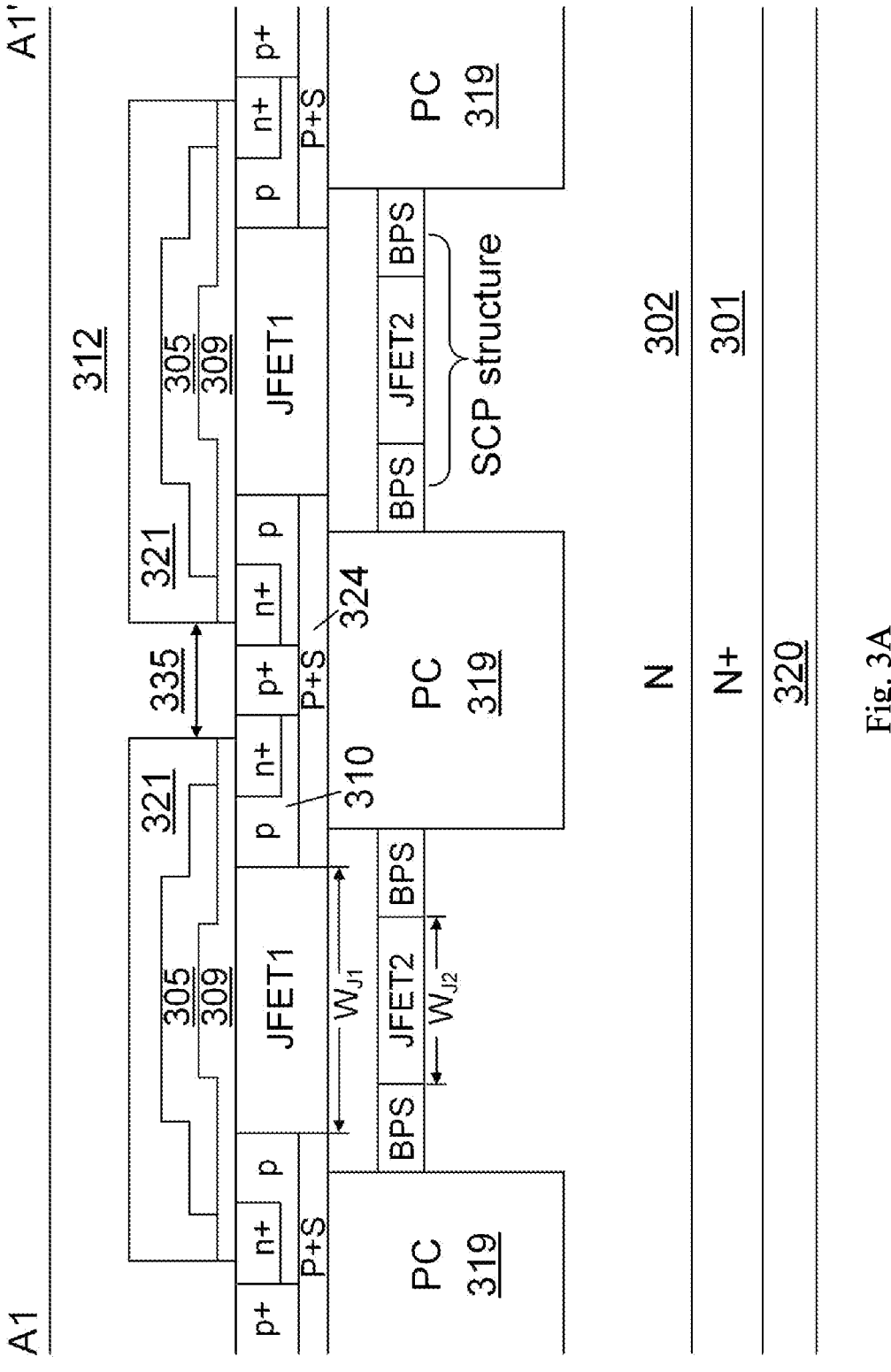
FIG. 3A is a cross-sectional view of a SiC device showing another preferred embodiment along A1-A1' line of FIG. 2A according to the present invention.

Please refer to FIG. 3A for a cross-sectional view showing another preferred A1-A1' cross section of FIG. 2A according to the present invention. The SiC device has a similar structure to FIG. 2B, except that the present invention further comprises a p+ shielding (P+S, as illustrated) region 324 sandwiched between the p body region 310 and the PC region 319.

Figure 3B:
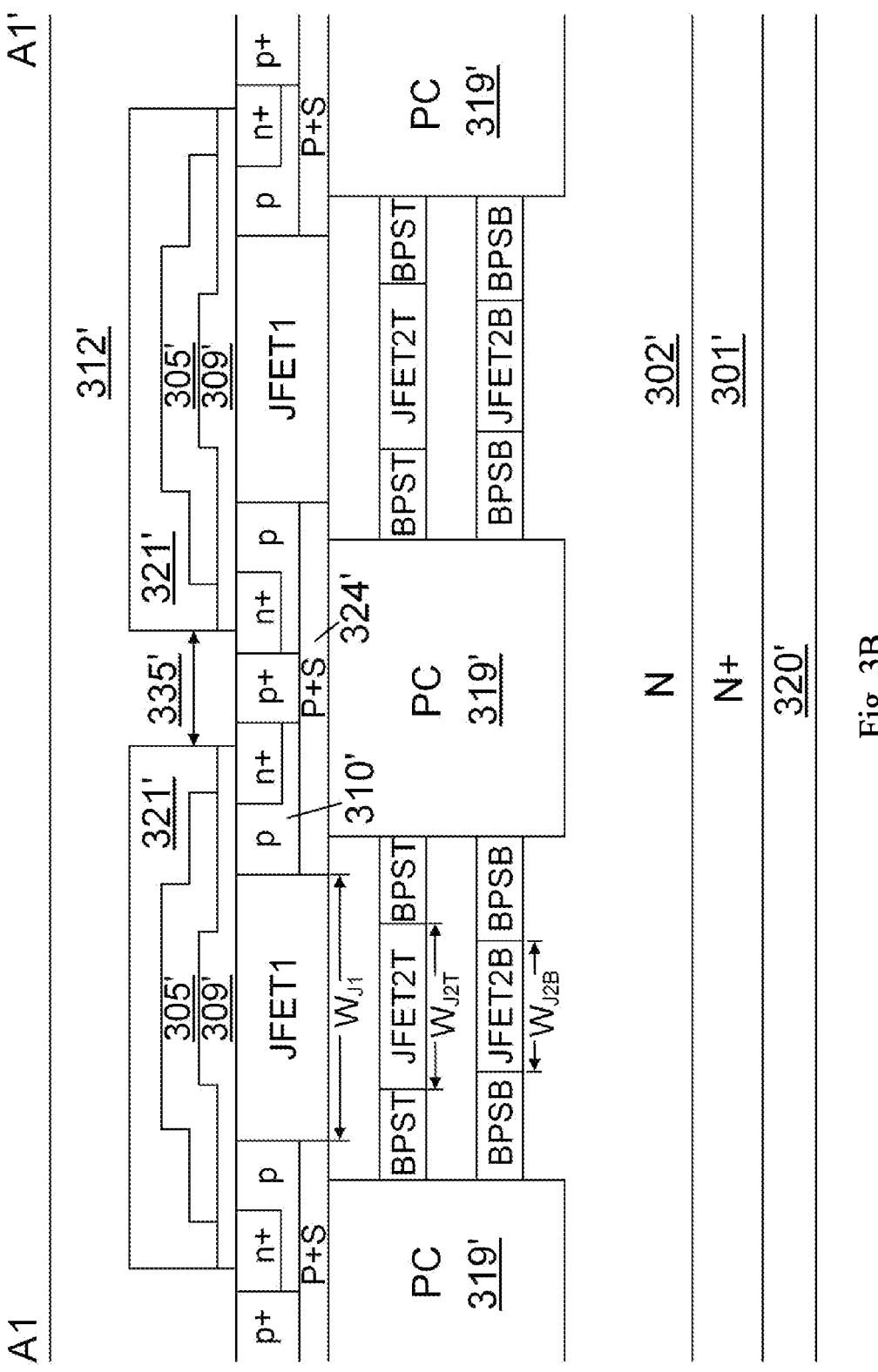
FIG. 3B is a cross-sectional view of a SiC device showing another preferred embodiment along A1-A1' line of FIG. 2A according to the present invention.

Please refer to FIG. 3B for a cross-sectional view showing another preferred A1-A1' cross section of FIG. 2A according to the present invention. The SiC device has a similar structure to FIG. 2C, except that the present invention further comprises a p+ shielding (P+S, as illustrated) region 324' sandwiched between the p body region 310' and the PC region 319'.

Figure 3C:
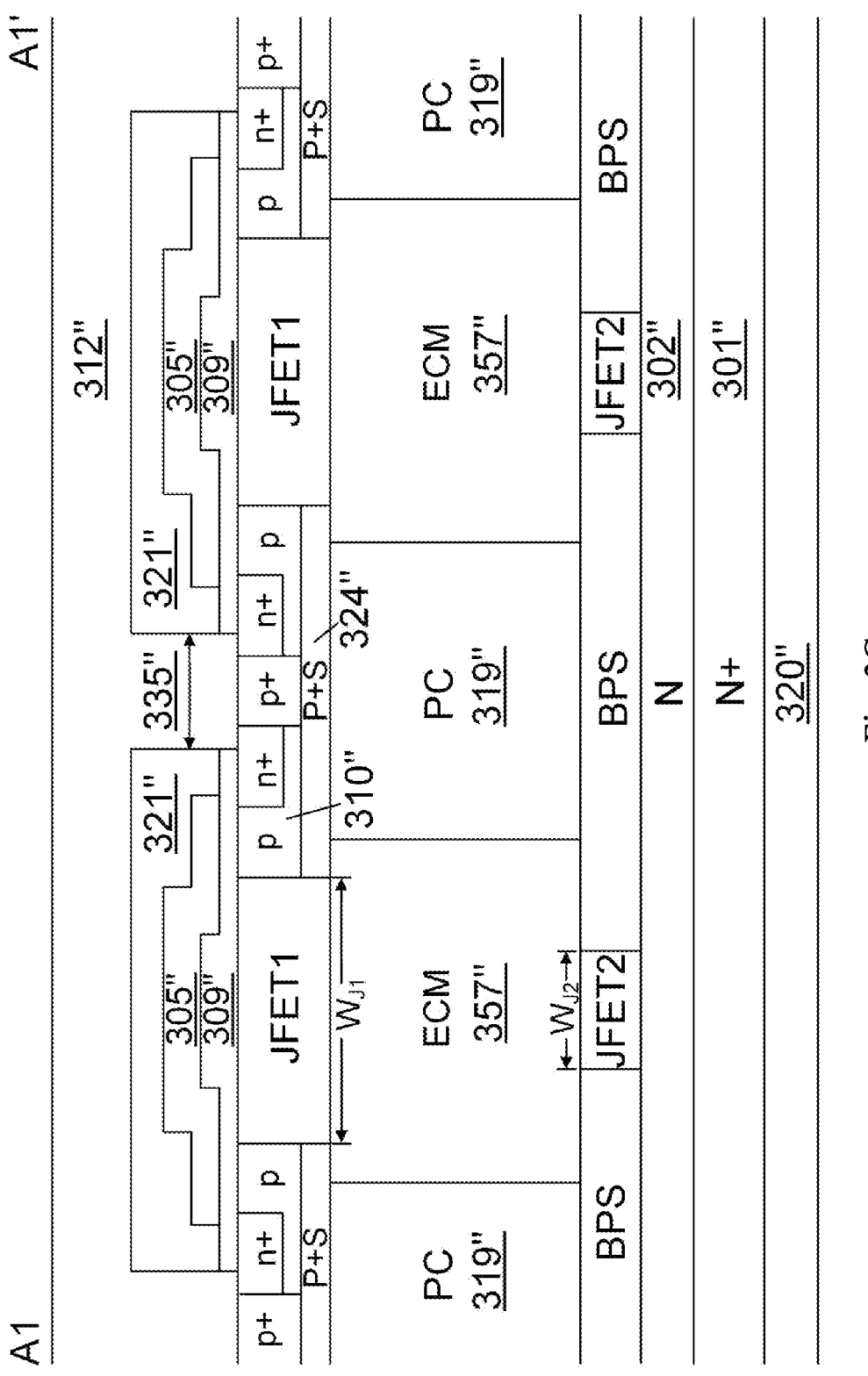
FIG. 3C is a cross-sectional view of a SiC device showing another preferred embodiment along A1-A1' line of FIG. 2A according to the present invention.

Please refer to FIG. 3C for a cross-sectional view showing another preferred A1-A1' cross section of FIG. 2A according to the present invention. The SiC device has a similar structure to FIG. 2D, except that the present invention further comprises a p+ shielding (P+S, as illustrated) region 324" sandwiched between the p body region 310" and the PC region 319".

Figure 4:
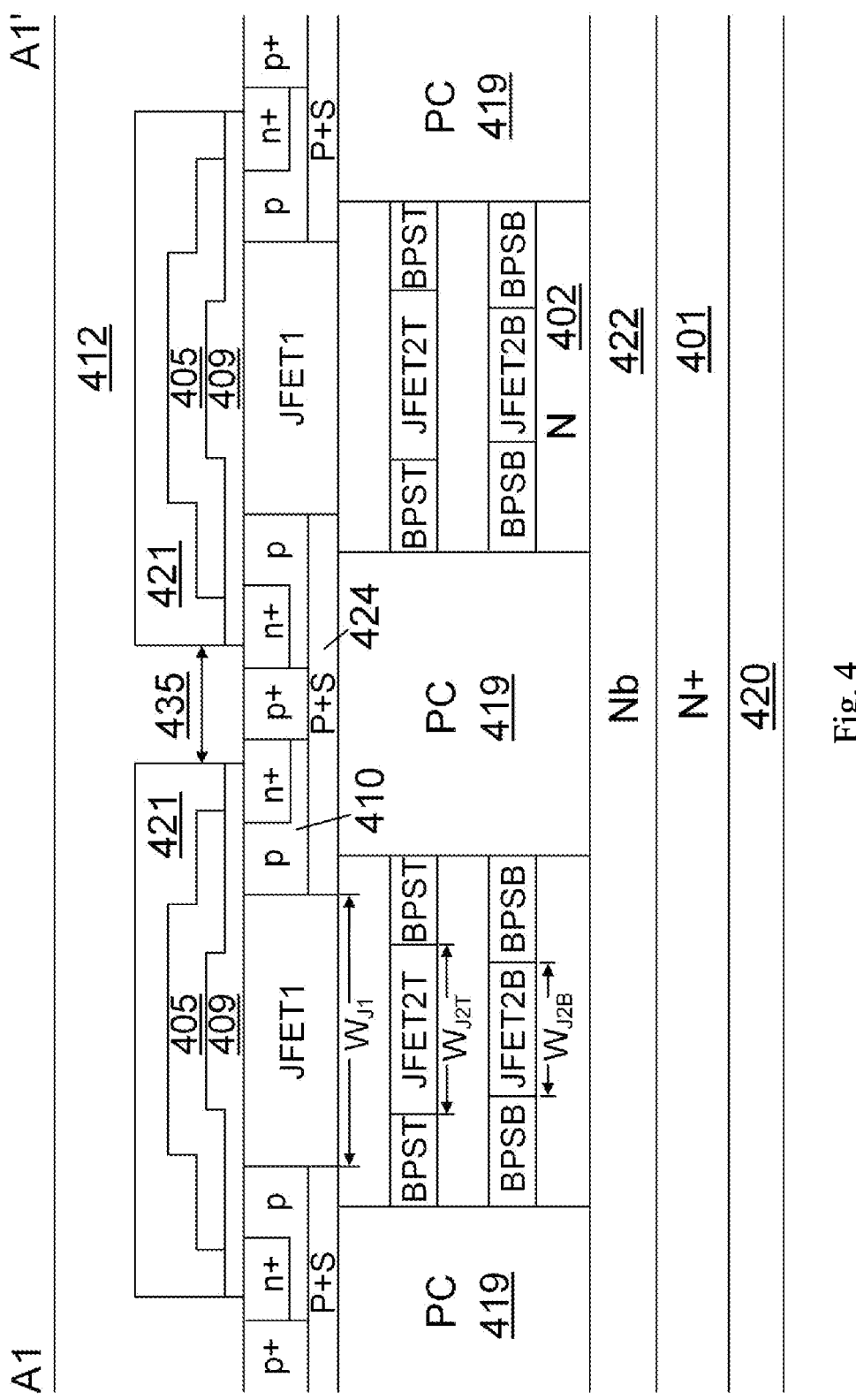
FIG. 4 is a cross-sectional view of a SiC device showing another preferred embodiment along A1-A1' line of FIG. 2A according to the present invention.

Please refer to FIG. 4 for a cross-sectional view showing another preferred A1-A1' cross section of FIG. 2A according to the present invention. The SiC device has a similar structure to FIG. 3B, except that the present invention further comprises a N buffer layer (Nb, as illustrated) 422 with a resistivity Rb sandwiched between the N+ substrate 401 and the P column (PC, as illustrated) region 419, wherein Rb is higher than a resistivity R of the N type epitaxial layer 402.

Figure 5A:
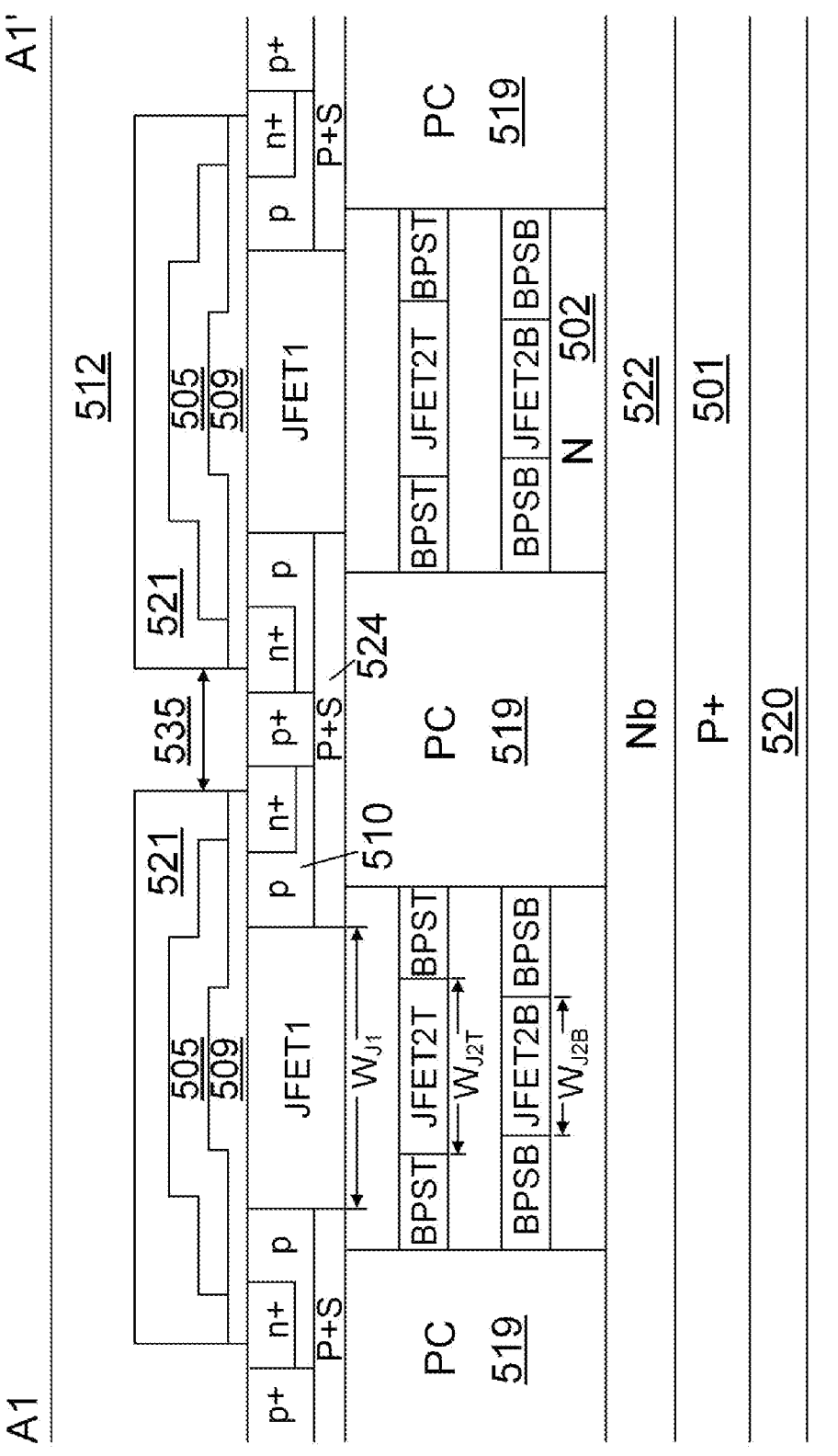
FIG. 5A is a cross-sectional view of a SiC device showing another preferred embodiment along A1-A1' line of FIG. 2A according to the present invention.

Please refer to FIG. 5A for a cross-sectional view showing another preferred A1-A1' cross section of FIG. 2A according to the present invention. The SiC device has a similar structure to FIG. 3B, except for the different substrate. In this invention, the SiC device is formed on a P+ substrate 501, and the invention in FIG. 5A further comprises an N buffer layer 522 (Nb, as illustrated) with a resistivity Rb sandwiched between the P+ substrate 501 and the P column (PC, as illustrated) region 519, wherein Rb is lower than a resistivity R of the N type epitaxial layer 502.

Figure 5B:
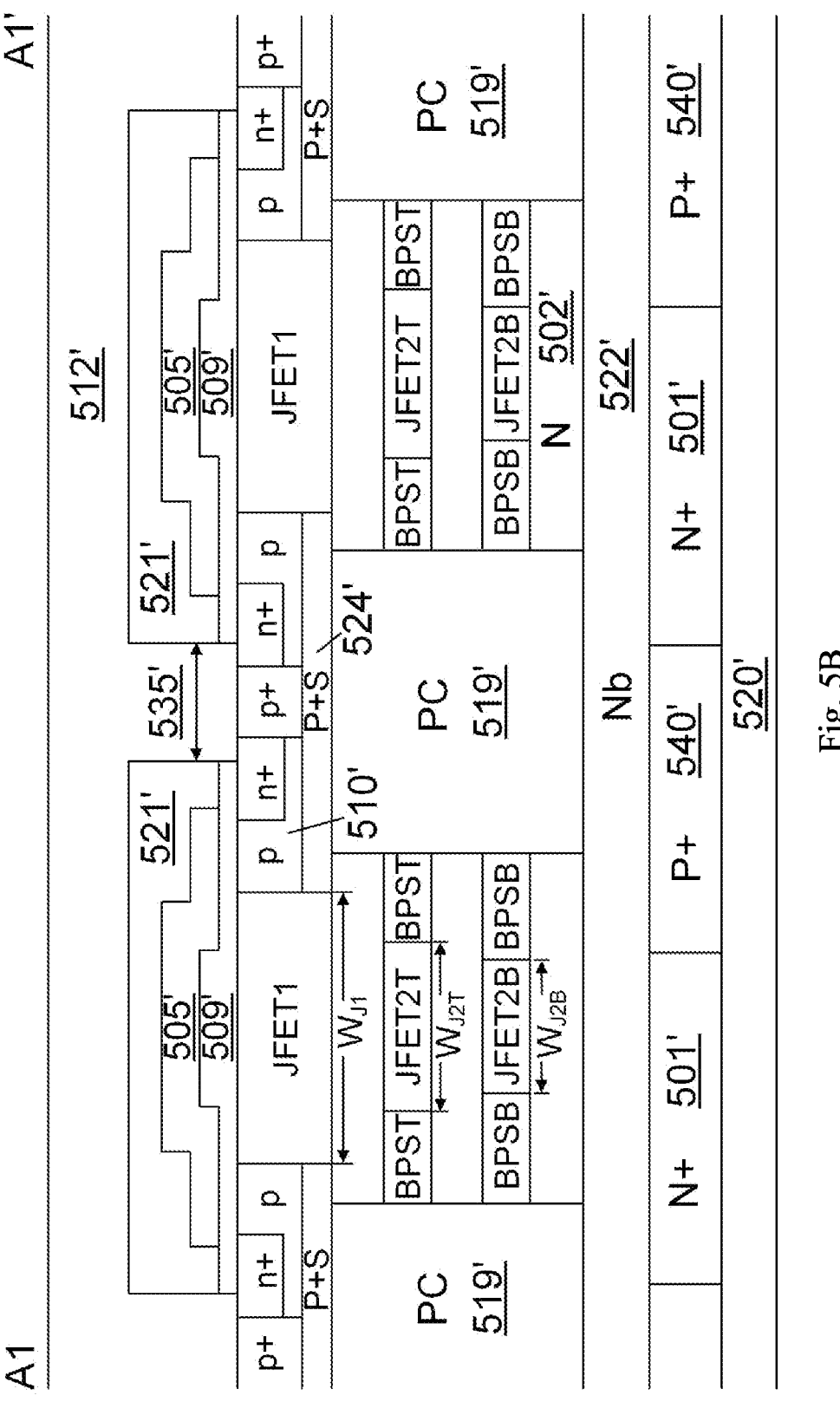
FIG. 5B is a cross-sectional view of a SiC device showing another preferred embodiment along A1-A1' line of FIG. 2A according to the present invention.

Please refer to FIG. 5B for a cross-sectional view showing another preferred A1-A1' cross section of FIG. 2A according to the present invention. The SiC device has a similar structure to FIG. 5A, except that, the SiC device in FIG. 5B further comprises a plurality of heavily doped N+ regions 540' in the P+substrate 501' to form a plurality of alternating P+ and N+ regions in the substrate.

Figure 6A:
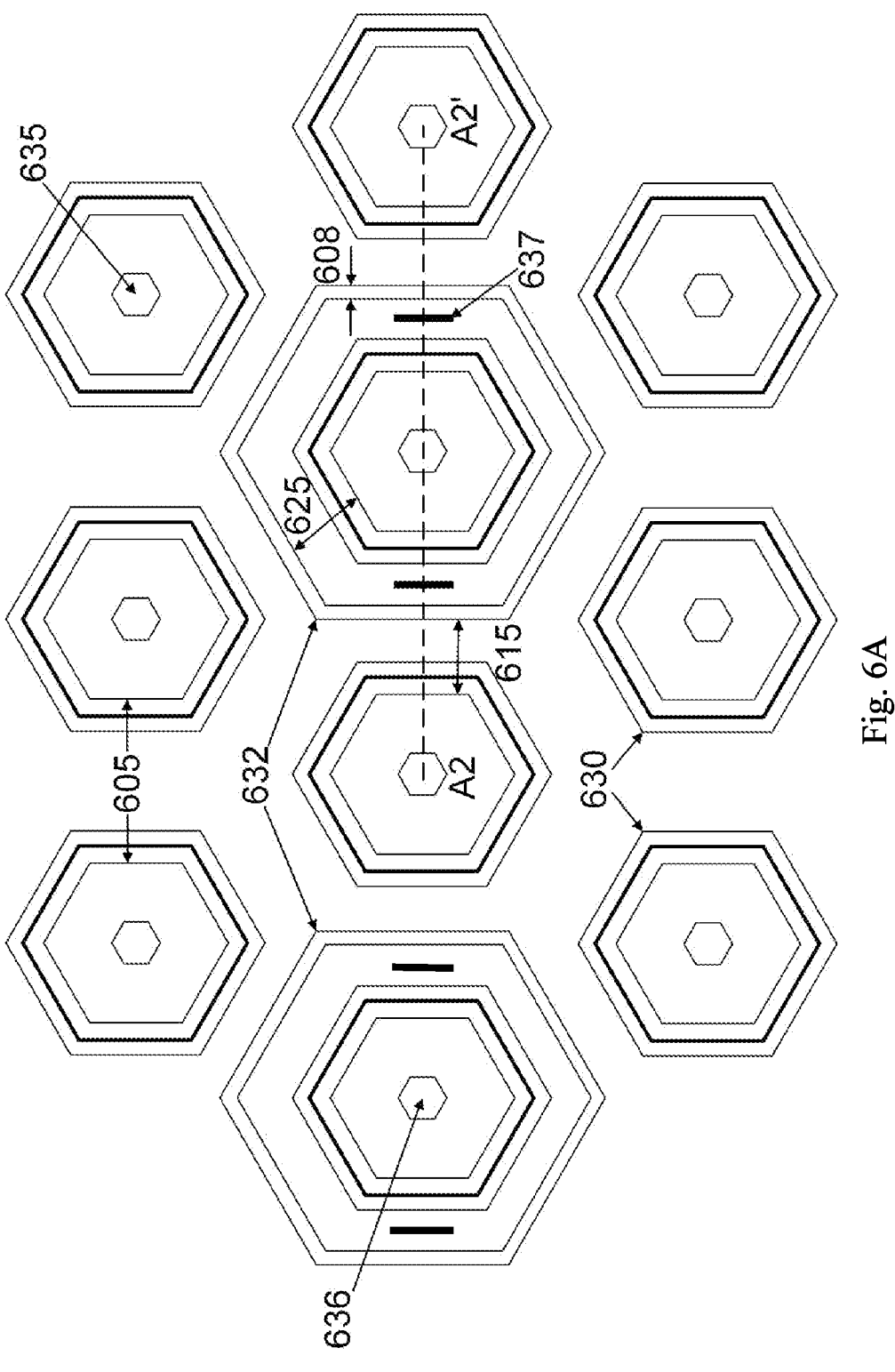
FIG. 6A is a top view of another preferred embodiment according to the present invention.

Please refer to FIG. 6A for a top view of an integrated circuit comprising a SiC MOSFET 630 and a SiC SBR 632 disposed in one unit cell having an asymmetric planar gate electrode structure. Each MOSFET cell 630 has a source contact 635 surrounded by a gate poly silicon layer 605 as a gate electrode, while each SBR cell 632 has a SBR gate contact 637 and a source contact 636 surrounded by a gate poly silicon layer 625, and a poly gap 608 is formed between the MOSFET cell 630 and the SBR cell 632.

Figure 6B:
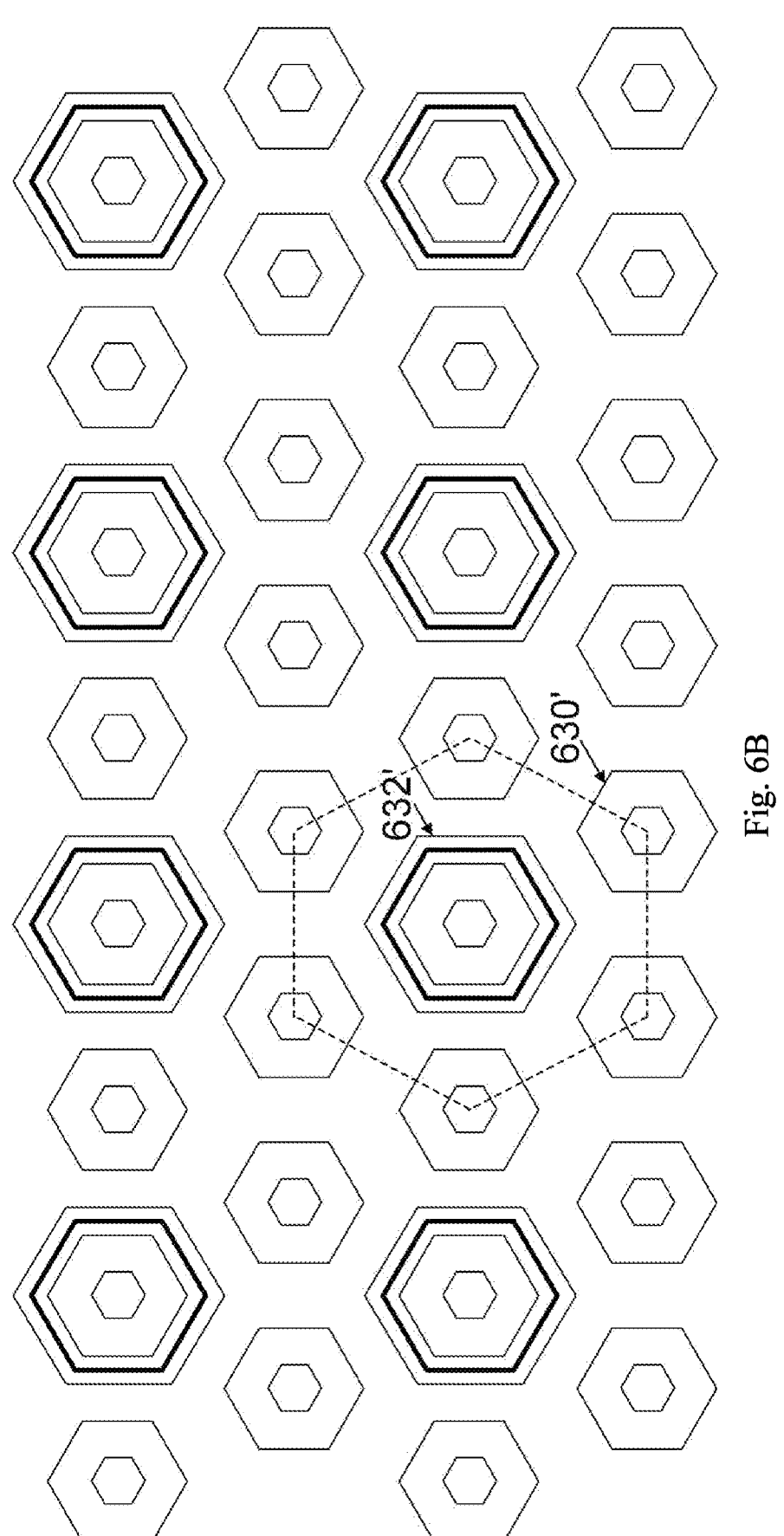
FIG. 6B is a brief top view of another preferred embodiment according to the present invention.

Please refer to FIG. 6B for a brief top view of an integrated circuit for a SiC device comprising a SiC MOSFET 630' and a SiC SBR 632' disposed in one unit cell, wherein each SiC SBR cell 632' is surrounded with six SiC MOSFETs 630'.

Figure 6C:
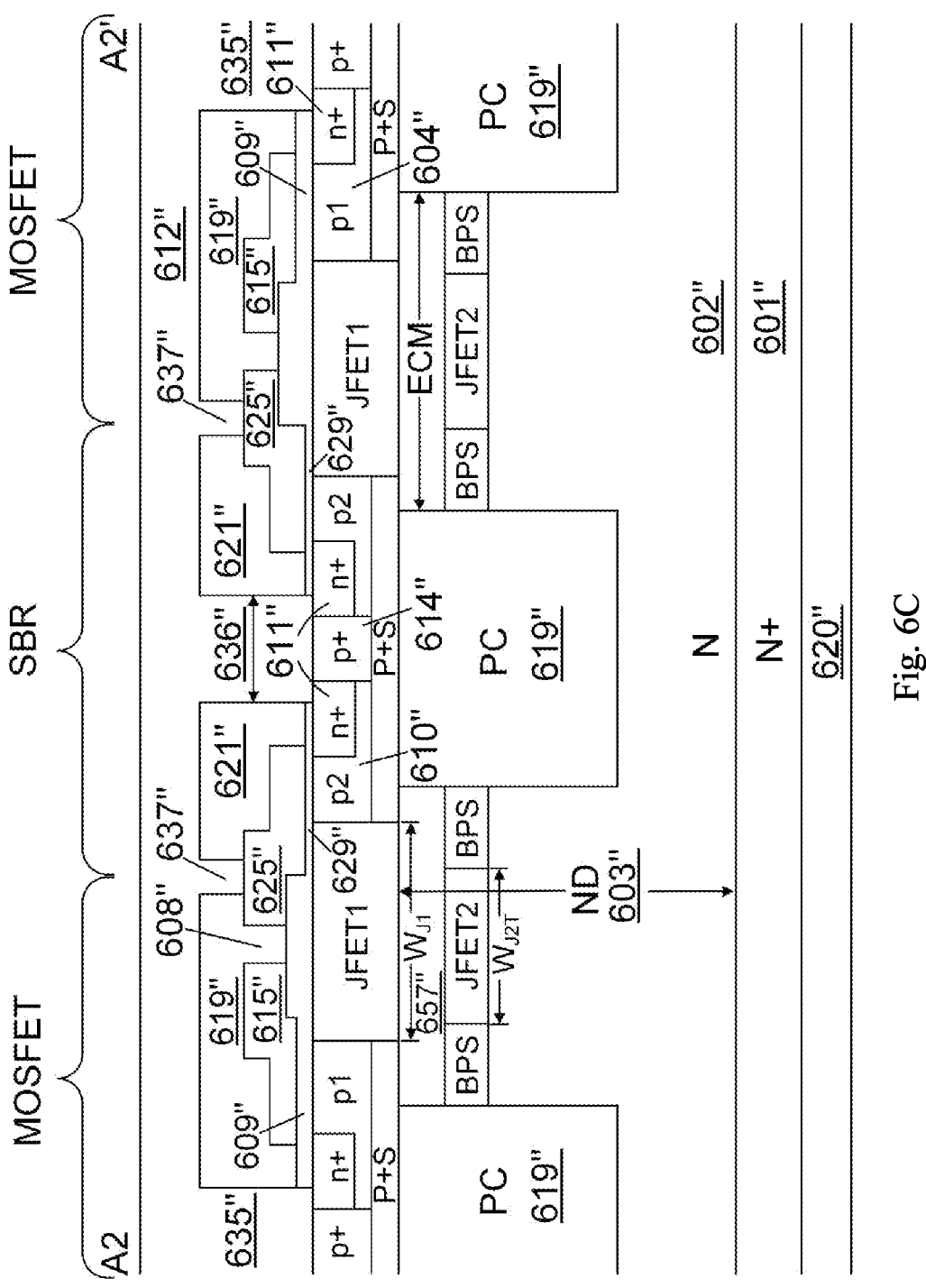
FIG. 6C is a cross-sectional view of a SiC device showing a preferred embodiment along A2-A2' line of FIG. 6A according to the present invention.

Please refer to FIG. 6C for a cross-sectional view showing a preferred A2-A2' cross section of FIG. 6A according to the present invention, wherein a SiC MOSFET and a SiC SBR are integrated on one unit cell having an asymmetric planar gate electrode structure. The SiC device in the present invention has a similar structure to FIG. 3A except for the different structure above the N drift (ND, as illustrated) region 603". In FIG. 6C, n+ source regions 611" are encompassed in a first p body (p1, as illustrated) region 604" at one side of a top portion of the N type epitaxial layer 602" in the SiC MOSFET and a second p body ((p2, as illustrated) region 610" at the other side in the SiC SBR. Moreover, an asymmetric planar gate electrode structure is formed having a first gate electrode 615" isolated from the N type epitaxial layer 602" with a first gate oxide 609" of the SiC MOSFET, and a second gate electrode 625" isolated from the N type epitaxial layer 602" with a second gate oxide 629" of the SiC SBR, wherein the second gate oxide 629" has a thickness less than a thickness of the first gate oxide 609". According to this invention, a first channel region is formed between the p1 region 604" and the n+ source region 611", and a second channel region is formed between the p2 region 610" and the n+ source region 611", wherein the second channel region has a channel length shallower than a channel length of the first channel region. Moreover, the n+ source region 611" and the p2 region 610" of the SiC SBR are shorted together with the second gate electrode 625" to a source metal 612" through a source contact 636" and a gate contact 637". An enhanced conductivity modulation (ECM, as illustrated) region 657" is formed between the JFET1 and JFET2 regions with a doping concentration equal to or higher than a doping concentration of the epitaxial layer 602".

Figure 6D:
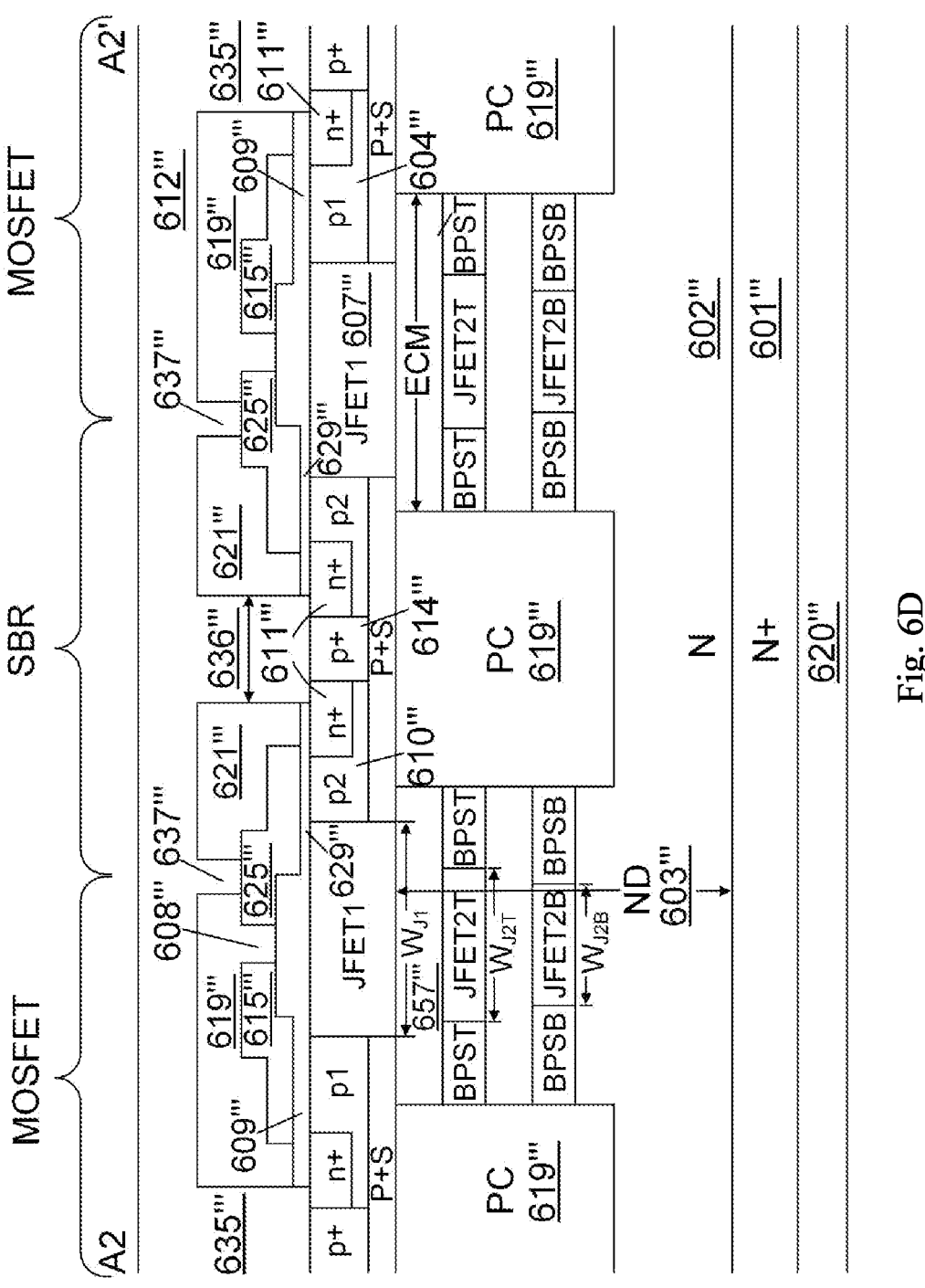
FIG. 6D is a cross-sectional view of a SiC device showing another preferred embodiment along A2-A2' line of FIG. 6A according to the present invention.

Please refer to FIG. 6D for a cross-sectional view showing a preferred A2-A2' cross section of FIG. 6A according to the present invention, wherein a SiC MOSFET and a SiC SBR are integrated on one unit cell having an asymmetric planar gate electrode structure. The SiC device in the present invention has a similar structure to FIG. 3B, except for the different structure above the N drift (ND, as illustrated) region 603'''. In FIG. 6D, n+ source regions 611''' are encompassed in a first p body (p1, as illustrated) region 604''' at one side of a top portion of the N type epitaxial layer 602''' in the SiC MOSFET and a second p body ((p2, as illustrated) region 610''' at the other side in the SiC SBR. Moreover, an asymmetric planar gate electrode structure is formed having a first gate electrode 615''' isolated from the N type epitaxial layer 602''' with a first gate oxide 609''' of the SiC MOSFET, and a second gate electrode 625''' isolated from the N type epitaxial layer 602''' with a second gate oxide 629''' of the SiC SBR, wherein the second gate oxide 629''' has a thickness less than a thickness of the first gate oxide 609'''. According to this invention, a first channel region is formed between the p1 region 604''' and the n+ source region 611''', and a second channel region is formed between the p2 region 610''' and the n+ source region 611''', wherein the second channel region has a channel length shallower than a channel length of the first channel region.

Figure 6E:
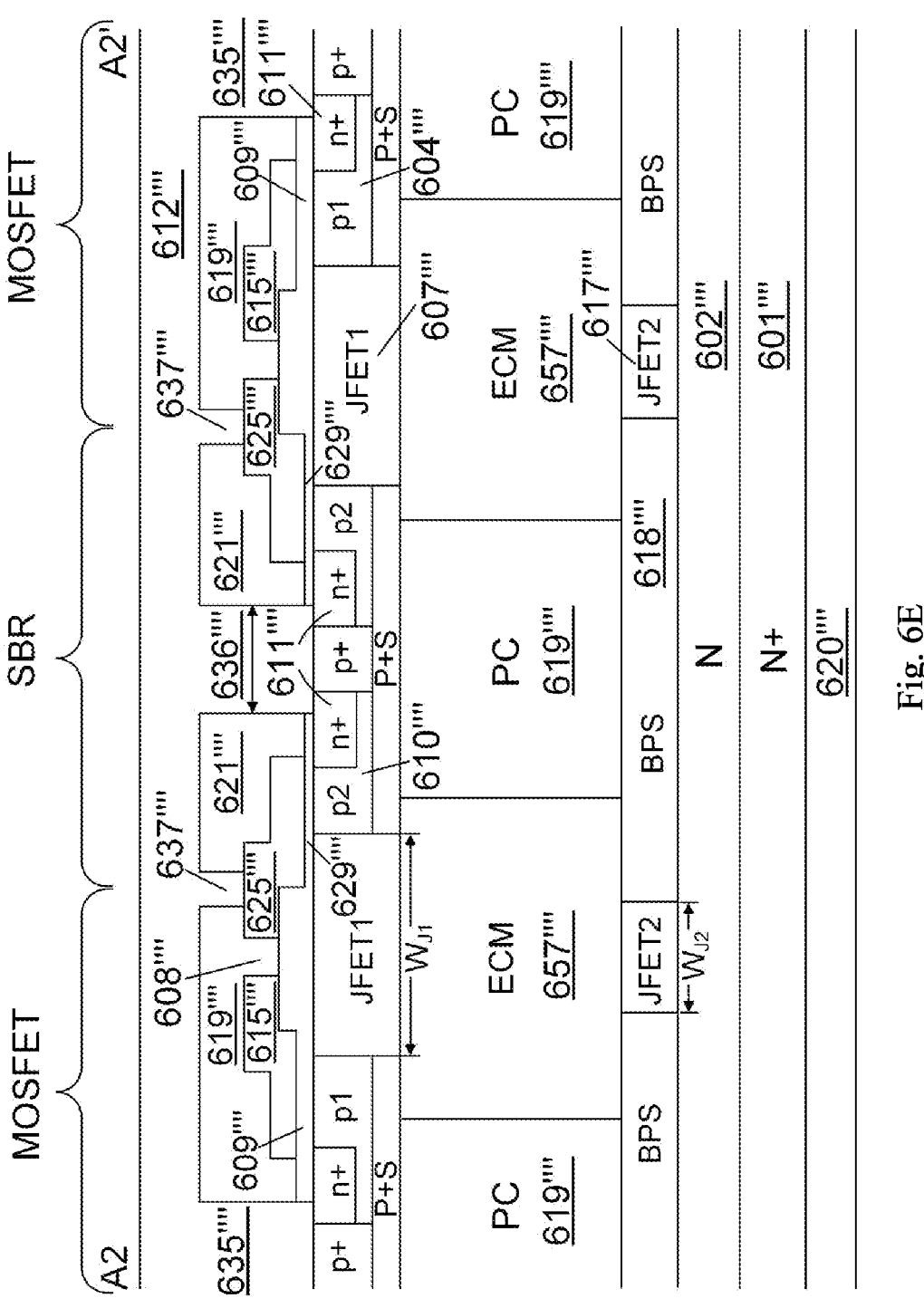
FIG. 6E is a cross-sectional view of a SiC device showing another preferred embodiment along A2-A2' line of FIG. 6A according to the present invention.

Please refer to FIG. 6E for a cross-sectional view showing a preferred A2-A2' cross section of FIG. 6A according to the present invention, wherein a SiC MOSFET and a SiC SBR are integrated on one unit cell having an asymmetric planar gate electrode structure. The SiC device in the present invention has a similar structure to FIG. 6C, except that in the present invention, the buried P-shield (BPS, as illustrated) regions 618"" are formed adjoining a bottom surface of the P column (PC, as illustrated) regions 619"" and laterally extending beyond edges of the PC regions 619"" with a width wider than a width of the PC region 619"". Moreover, a second type JFET (JFET2, as illustrated) region 617"" is formed between the two adjacent BPS regions 618"" with a width $W_{J2}$ less than a width Wn of the first type JFET (JFET1, as illustrated) region 607"".

Figure 7A:
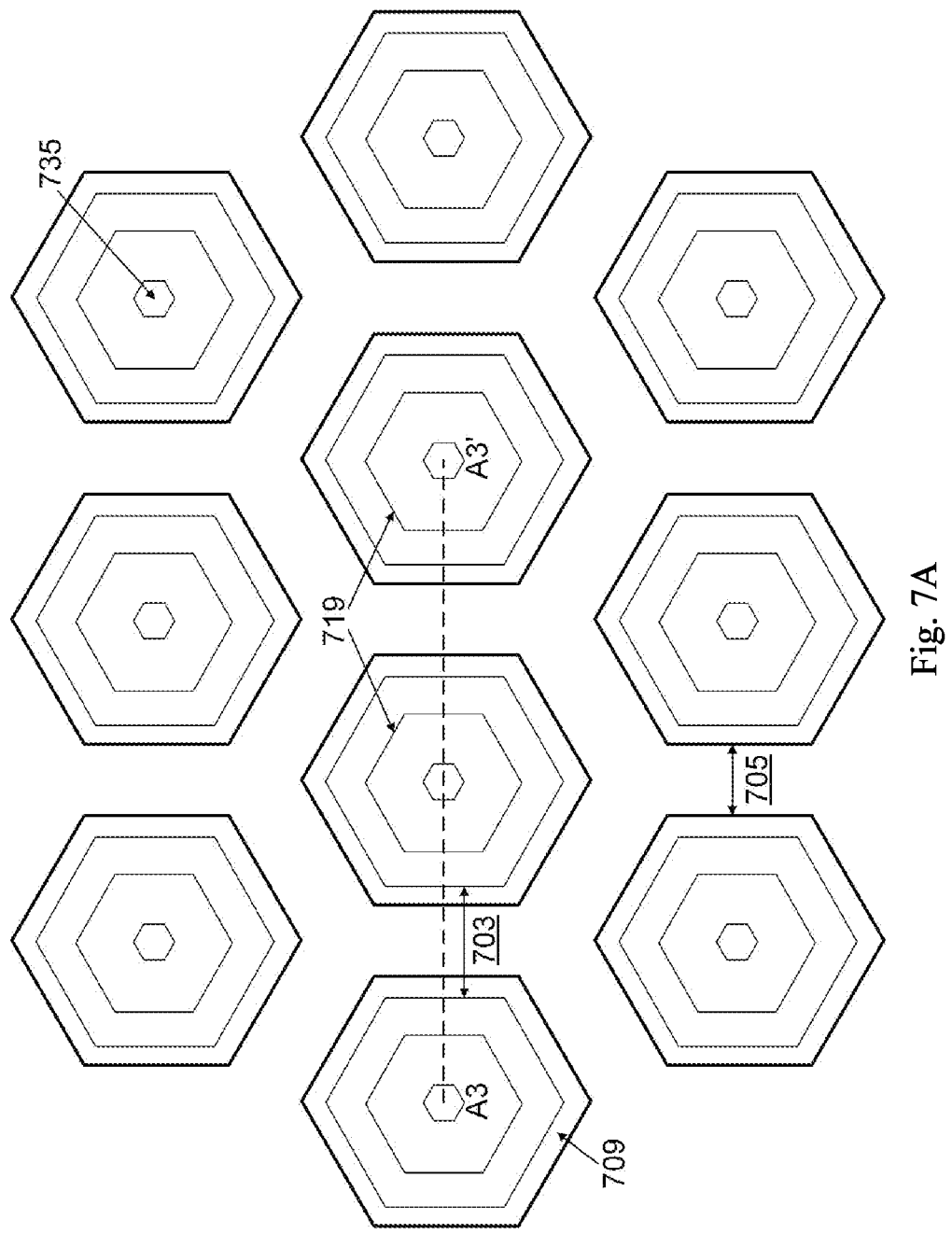
FIG. 7A is a top view of another preferred embodiment according to the present invention.

Please refer to FIG. 7A for a top view of another preferred embodiment for a SiC device comprising a plurality of unit cells in an active area. Each of the unit cells has a P column (PC, as illustrated) region 719 with a hexagonal topology, a source contact 735, and a gate trench 703 formed between the two adjacent PC regions 719. Moreover, a gate oxide 709 is formed between the gate trench 703 and a gate electrode 705.

Figure 7B:
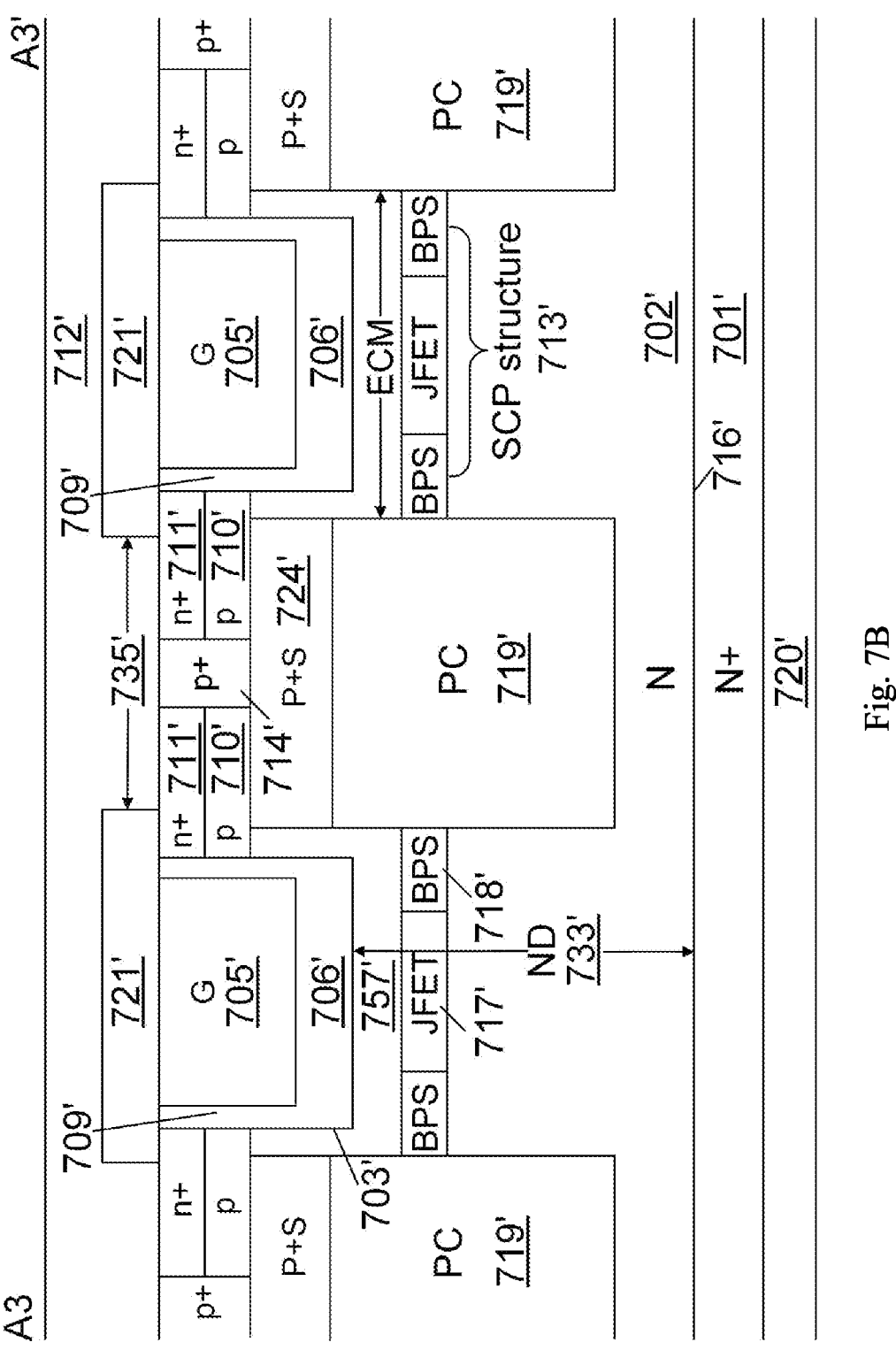
FIG. 7B is a cross-sectional view of a SiC device showing a preferred embodiment along A3-A3' line of FIG. 7A according to the present invention.

Please refer to FIG. 7B for a cross-sectional view showing another preferred A3-A3' cross section of FIG. 7A according to the present invention. The preferred embodiment comprises a SiC device formed on an N+ type SiC substrate 701' with a less doped N type SiC epitaxial layer 702' extending thereon, wherein the N+ substrate 701' is coated with a back metal 720' of Ti/Ni/Ag on the rear side as a drain metal. Inside the N type epitaxial layer 702', a plurality of gate trenches 703' are formed vertically downward from a top surface of the N type epitaxial layer 702' and not reaching the interface 716' between the N type epitaxial layer 702' and the N+ substrate 701', and a gate electrode 705' is formed in the gate trenches 703' and surrounded with a thick bottom oxide as a first insulating film 706' on a bottom of the gate trenches 703', and with a gate oxide 709' on sidewalls of the gate trenches 703', wherein the gate oxide 709' has a less thickness than the first insulating film 706'. Between every two adjacent gate trenches 703', a p body region 710' with n+ source regions 711' thereon is extending at a top portion of the N type epitaxial layer 702' and surrounding the gate electrode 705' padded by the gate oxide 709'. Between every two adjacent gate trenches 703' and below the p body regions 710', a P column (PC, as illustrated) region 719' is formed, and a p+ heavily doped region 714' is formed between the n+ source regions 711' above the PC columns 719'. Moreover, a p+ shielding (P+S, as illustrated) region 724' is formed between the p body region 710' and the PC region 719'. An interlayer dielectric film 721' is stacked on the N type epitaxial layer 702' covering top surfaces of the gate electrode 705', the gate oxide 709' and a portion of n+ source region 711', and a source metal 712 is then formed onto a top surface of the device to connect together the PC region 719', the n+ source regions 711' and the p body regions 710'. Between the two adjacent PC regions 719' and below the gate trenches 703', two buried P-shield (BPS, as illustrated) regions 718' facing each other are formed with a doping concentration higher than that of the PC region 719' adjoining sidewalls of the PC regions 719' and spaced apart from the p body region 710'. Moreover, a saturation current pinching (SCP) structure 713' is disposed in an N-drift (ND, as illustrated) region 733' between the substrate 701' and a bottom of the gate trench 703' comprising a JFET region 717' formed between the two BPS regions 718'. An enhanced conductivity modulation (ECM, as illustrated) region 757' is formed in the ND region 733' between the bottom of the gate trench 703' and the JFET region 717' with a doping concentration equal to or higher than a doping concentration of the epitaxial layer 702'.

Figure 7C:
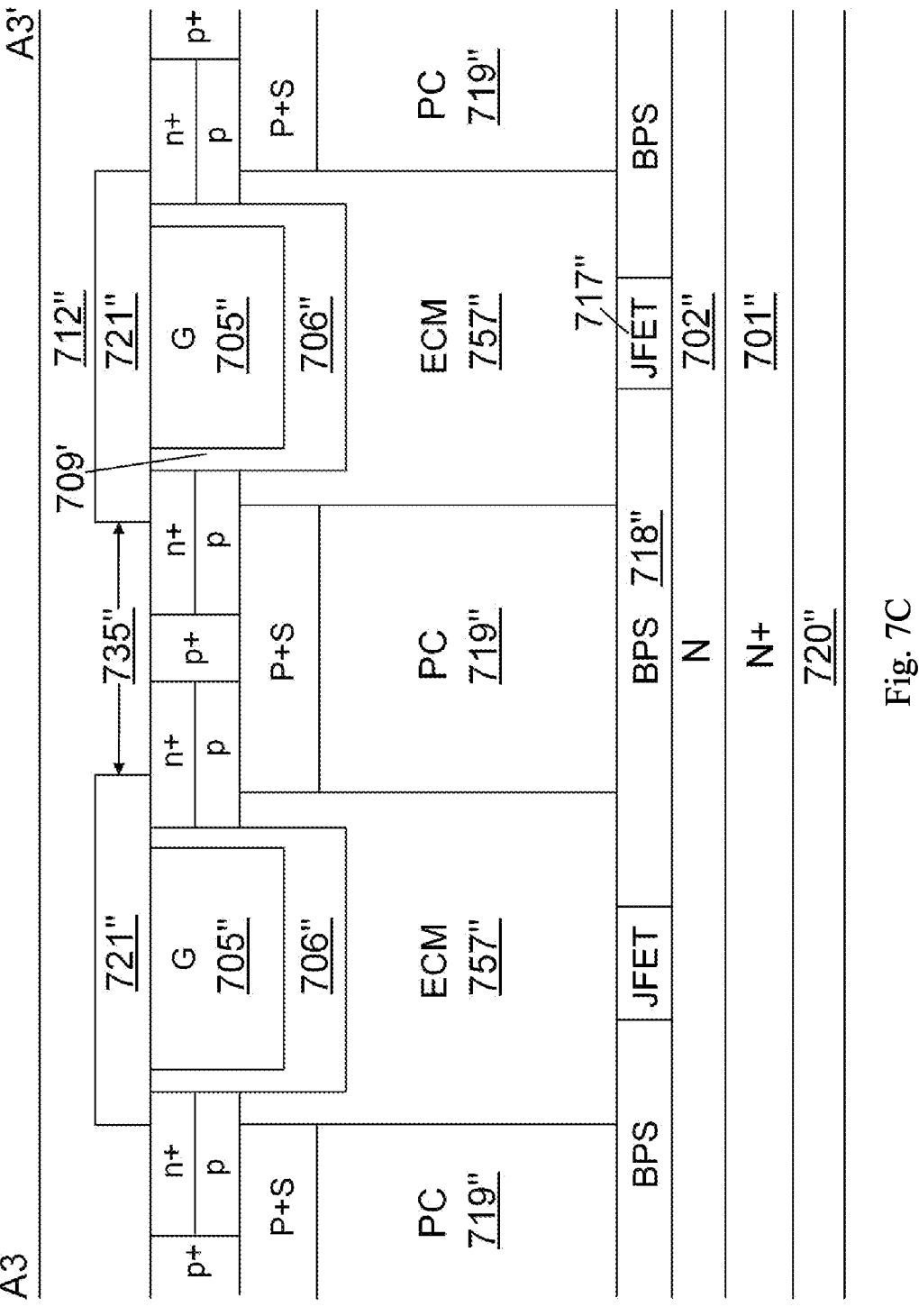
FIG. 7C is a cross-sectional view of a SiC device showing another preferred embodiment along A3-A3' line of FIG. 7A according to the present invention.

Please refer to FIG. 7C for a cross-sectional view showing another preferred A3-A3' cross section of FIG. 7A according to the present invention. The SiC device has a similar structure to FIG. 7B, except that in the present invention, the buried P-shield (BPS, as illustrated) regions 718" are formed adjoining a bottom surface of the P column (PC, as illustrated) regions 719" and laterally extending beyond edges of the PC regions 719" with a width wider than a width of the PC region 719". Moreover, a JFET region 717" is formed between the two BPS regions 718".

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A silicon carbide (SiC) device comprising a plurality of unit cells with each unit cell in an active area, comprising:
   an epitaxial layer of a first conductivity type comprising multiple sub-epitaxial layers grown on a substrate;
   a source region of a first conductivity type formed at a top portion of said epitaxial layer and encompassed in a body region of a second conductivity type;
   a super junction (SJ) structure generated by said epitaxial layer with a P column (PC) region of said second conductivity type disposed above said substrate and connecting to said body region;
   a planar gate electrode made of a doped poly-silicon layer padded by a gate oxide;
   a first type Junction Field Effect Transistor (JFET) region of said first conductivity type formed between two adjacent said body regions;

an N-drift (ND) region of said first conductivity type formed between said substrate and said first type JFET region;
   at least two buried P-shield (BPS) regions of said second conductivity type facing each other with a doping concentration higher than a doping concentration of said PC region, adjoining said PC region and spaced apart from said body region;
   a second type JFET regions of said first conductivity type formed between said two BPS regions;
   at least one saturation current pinching (SCP) region disposed between two said adjacent PC regions comprising said second type JFET and said two BPS regions;
   an enhanced conductivity modulation (ECM) region of said first conductivity type formed in said ND region between said first type JFET and said second type JFET region; and
   said source and body regions shorted together to a source metal.

2. The SiC device of claim 1, wherein said PC region has a linear, a square, a hexagonal or an octagonal topology and formed by a multiple epitaxial growth method.

3. The SiC device of claim 1, wherein said gate oxide having a thick oxide in its central portion.

4. The SiC device of claim 1, wherein said ECM region has a doping concentration equal to or higher than doping concentrations of said sub-epitaxial layers below said ECM region.

5. The SiC device of claim 1, wherein said two BPS regions adjoining sidewalls of said PC region.

6. The SiC device of claim 1, wherein said two BPS regions adjoining a bottom surface of said PC region and laterally extending beyond edges of said PC region with a width wider than a width of said PC region.

7. The SiC device of claim 1, wherein said first type JFET region has a width greater than a width of said second type JFET region, and has a doping concentration less than a doping concentration of said second type JFET region.

8. The SiC device of claim 1, wherein said ND region has two second type JFET regions including a bottom JFET region with a width $W_{J2B}$ and a top JFET region above said bottom JFET region with a width $W_{J2T}$, wherein said $W_{J2B} < W_{J2T}$.

9. The SiC device of claim 1, further comprising a P+ shielding region of said second conductivity type sandwiched between said body region and said PC region.

10. The SiC device of claim 1, wherein said substrate has said first conductivity type and further comprises a buffer layer of said first conductivity type with a resistivity Rb sandwiched between said substrate and said PC region, wherein said Rb is higher than a resistivity R of said epitaxial layer.

11. The SiC device of claim 1, wherein said substrate has said second conductivity type and further comprises a buffer layer of said first conductivity type with a resistivity Rb sandwiched between said substrate and said PC region, wherein said Rb is less than a resistivity R of said epitaxial layer.

12. The SiC device of claim 1, wherein said substrate has said second conductivity type, further comprises a buffer layer of said first conductivity type formed sandwiched between said substrate and said PC region with a resistivity Rb lower than a resistivity R of said epitaxial layer; a plurality of heavily doped regions of said first conductivity type in said substrate to form a plurality of alternating P+ and N+ regions in said substrate.

13. An integrated circuit comprising a SiC MOSFET and a SiC SBR (super barrier rectifier) disposed in one unit cell having an asymmetric planar gate electrode structure comprising:

an epitaxial layer of a first conductivity type comprising multiple sub-epitaxial layers grown on a substrate;

said asymmetric planar gate electrode structure formed in said epitaxial layer has a first gate electrode isolated from said epitaxial layer with a first gate oxide of said SiC MOSFET, and a second gate electrode isolated from said epitaxial layer with a second gate oxide of said SiC SBR, wherein said second gate oxide has a thickness less than a thickness of said first gate oxide;

a source region of said first conductivity type encompassed in a first body region of said second conductivity type at one side of a top portion of said epitaxial layer in said SiC MOSFET and encompassed in a second body region of said second conductivity at the other side in said SiC SBR;

a first channel region formed between said first body region and said source region;

a second channel region formed between said second body region and said source region; wherein said second channel region has a channel length shallower than a channel length of said first channel region;

said source region and said second body region of said SiC SBR shorted together with said second gate electrode to a source metal through a source contact and a gate contact of said SiC SBR;

said integrated circuit further comprising:

a SJ structure generated by said epitaxial layer with a PC region of said second conductivity type disposed above said substrate and connecting to said body region;

a first type first type Junction Field Effect Transistor (JFET) region of said first conductivity type formed between two adjacent said body regions;

an ND region of said first conductivity type formed between said substrate and said first type JFET region;

at least two BPS regions of said second conductivity type facing each other with a doping concentration higher than a doping concentration of said PC region, adjoining said PC region and spaced apart from said body region;

a second type JFET regions of said first conductivity type formed between said two BPS regions;

at least one saturation current pinching (SCP) region disposed between two said adjacent PC regions comprising said second type JFET and said two BPS regions;

an enhanced conductivity modulation (ECM) region of said first conductivity type formed in said ND region between said first type JFET and said second type JFET region with a doping concentration not less than doping concentrations of said sub-epitaxial layers below said ECM region; and said source region, said first and second body regions shorted together to said source metal.

14. The integrated circuit of claim 13, wherein said PC region has a hexagonal shape and formed by a multiple epitaxial growth method.

15. The integrated circuit of claim 13, wherein said first and second gate oxides having a thick oxide in their central portions.

16. The integrated circuit of claim 13, wherein said BPS region adjoining sidewalls of said PC region or adjoining a bottom of said PC region with a width wider than a width of said PC region.

17. The integrated of claim 13, further comprising a P+ shielding region of said second conductivity type sandwiched between said body region and said PC region.

18. The integrated circuit of claim 13, wherein each said SiC SBR cell is surrounded by six said SiC MOSFET cells.

19. A SiC device comprising a plurality of unit cells with each unit cell in an active area, comprising:

an epitaxial layer of a first conductivity type comprising multiple sub-epitaxial layers grown on a substrate;

a gate trench formed in said epitaxial layer, and surrounded by a source region of said first conductivity type encompassed in a body region of a second conductivity type at a top portion of said epitaxial layer;

said gate trench being filled with a gate electrode, and insulated from said epitaxial layer by a first insulating film on a bottom of said gate trench, and being insulated from said epitaxial layer along sidewalls by a gate oxide;

said first insulating film is thicker than said gate oxide;

a source region of said first conductivity type formed at a top portion of said epitaxial layer and encompassed in a body region of said second conductivity type;

a SJ structure generated by said epitaxial layer with a PC region of said second conductivity type disposed above said substrate and connecting to said body region;

an ND region of said first conductivity type formed between said substrate and said bottom of said gate trench;

at least two BPS regions of said second conductivity type facing each other with a doping concentration higher than a doping concentration of said PC region, adjoining said PC region and spaced apart from said body region;

a JFET region of said first conductivity type formed between said two BPS regions;

a P+ shielding region of said second conductivity type sandwiched between said body region and said PC region;

at least one saturation current pitching (SCP) region disposed between said two adjacent PC regions comprising a JFET region and said two BPS regions;

an enhanced conductivity modulation (ECM) region of said first conductivity type formed in said ND region between said JFET region and said bottom of said gate trench with a doping concentration equal to or higher than doping concentrations of said sub-epitaxial layers below said ECM region; and said source and body regions shorted together to a source metal.

20. The SiC device of claim 19, wherein said BPS region adjoining sidewalls of said PC region, or adjoining a bottom of said PC region with a width wider than a width of said PC region.

* * * * *